(12) United States Patent
Yasunaga et al.

(10) Patent No.: US 9,024,454 B2
(45) Date of Patent: May 5, 2015

(54) METHOD OF MANUFACTURING SEMICONDUCTOR DEVICE

(71) Applicant: Renesas Electronics Corporation, Kanagawa (JP)

(72) Inventors: Masatoshi Yasunaga, Kanagawa (JP); Hironori Matsushima, Kanagawa (JP); Kenya Hironaga, Kanagawa (JP); Soshi Kuroda, Kangawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 14/294,029

(22) Filed: Jun. 2, 2014

(65) Prior Publication Data

US 2014/0273353 A1 Sep. 18, 2014

Related U.S. Application Data

(62) Division of application No. 12/889,023, filed on Sep. 23, 2010, now Pat. No. 8,772,952.

(30) Foreign Application Priority Data

Sep. 25, 2009 (JP) ................................ 2009-221116

(51) Int. Cl.
*H01L 23/00* (2006.01)
*H01L 25/065* (2006.01)
(Continued)

(52) U.S. Cl.
CPC .............. *H01L 24/85* (2013.01); *H01L 24/04* (2013.01); *H01L 24/27* (2013.01); *H01L 21/561* (2013.01); *H01L 22/32* (2013.01); *H01L 23/3128* (2013.01); *H01L 24/03* (2013.01); *H01L 24/05* (2013.01);
(Continued)

(58) Field of Classification Search
CPC ... H01L 23/49811; H01L 24/03; H01L 24/04; H01L 24/27; H01L 24/43; H01L 24/85
See application file for complete search history.

(56) References Cited

U.S. PATENT DOCUMENTS 3,672,047 A 6/1972 Sakamoto et al.
4,907,734 A 3/1990 Conru et al.
(Continued)

FOREIGN PATENT DOCUMENTS

JP 2-146439 U 12/1990
JP 6-163622 A 6/1994
(Continued)

OTHER PUBLICATIONS

Japanese Office Action with English translation issed in Japanese Application No. 2009-221116 dated Mar. 12, 2013.
(Continued)

*Primary Examiner* — Joseph C Nicely
(74) *Attorney, Agent, or Firm* — McDermott Will & Emery LLP

(57) ABSTRACT

To improve reliability of a semiconductor device in which wire bonding using a wire made of copper is performed. A semiconductor device is configured so that one of end parts (wide width part) of a copper wire is joined via a bump on a pad (electrode pad) formed over a main surface (first main surface) of a semiconductor chip of the semiconductor device. The bump is made of gold, which is a metal material having a hardness lower than that of copper, and the width of the bump is narrower than the width of the wide width part of the wire.

13 Claims, 25 Drawing Sheets

(51) Int. Cl.
*H01L 23/498* (2006.01)
*H01L 21/56* (2006.01)
*H01L 21/66* (2006.01)
*H01L 23/31* (2006.01)

(52) U.S. Cl.
CPC ............... *H01L 24/45* (2013.01); *H01L 24/48* (2013.01); *H01L 24/49* (2013.01); *H01L 24/97* (2013.01); *H01L 25/0657* (2013.01); *H01L 2224/02166* (2013.01); *H01L 2224/0401* (2013.01); *H01L 2224/04042* (2013.01); *H01L 2224/05553* (2013.01); *H01L 2224/05624* (2013.01); *H01L 2224/05644* (2013.01); *H01L 2224/32145* (2013.01); *H01L 2224/45015* (2013.01); *H01L 2224/45124* (2013.01); *H01L 2224/45144* (2013.01); *H01L 2224/45147* (2013.01); *H01L 2224/48091* (2013.01); *H01L 2224/48145* (2013.01); *H01L 2224/48227* (2013.01); *H01L 2224/48465* (2013.01); *H01L 2224/48482* (2013.01); *H01L 2224/48499* (2013.01); *H01L 2224/4903* (2013.01); *H01L 2224/49051* (2013.01); *H01L 2224/49171* (2013.01); *H01L 2224/49175* (2013.01); *H01L 2224/49431* (2013.01); *H01L 2224/85051* (2013.01); *H01L 2224/97* (2013.01); *H01L 2225/06506* (2013.01); *H01L 2225/0651* (2013.01); *H01L 2924/01004* (2013.01); *H01L 2924/01005* (2013.01); *H01L 2924/01013* (2013.01); *H01L 2924/01014* (2013.01); *H01L 2924/01022* (2013.01); *H01L 2924/01028* (2013.01); *H01L 2924/01029* (2013.01); *H01L 2924/01046* (2013.01); *H01L 2924/01047* (2013.01); *H01L 2924/0105* (2013.01); *H01L 2924/01057* (2013.01); *H01L 2924/01078* (2013.01); *H01L 2924/01079* (2013.01); *H01L 2924/01082* (2013.01); *H01L 2924/014* (2013.01); *H01L 2924/04941* (2013.01); *H01L 2924/10253* (2013.01); *H01L 2924/14* (2013.01); *H01L 2924/15311* (2013.01); *H01L 2924/20753* (2013.01); *H01L 2924/20754* (2013.01); *H01L 2924/20755* (2013.01); *H01L 2924/30105* (2013.01); *H01L 2924/3011* (2013.01); *H01L 2924/01006* (2013.01); *H01L 2924/01019* (2013.01); *H01L 2924/01033* (2013.01); *H01L 2224/05018* (2013.01); *H01L 2224/05557* (2013.01); *H01L 2224/05558* (2013.01); *H01L 2224/48624* (2013.01); *H01L 2224/48644* (2013.01); *H01L 2224/48844* (2013.01); *H01L 2224/48724* (2013.01); *H01L 23/49866* (2013.01); *H01L 24/43* (2013.01); *H01L 2224/05554* (2013.01)

(56) References Cited

U.S. PATENT DOCUMENTS

| | | | |
|---|---|---|---|
| 6,164,523 | A | 12/2000 | Fauty et al. |
| 6,413,797 | B2 | 7/2002 | Oka et al. |
| 6,534,863 | B2 | 3/2003 | Walker et al. |
| 6,650,013 | B2 | 11/2003 | Yin et al. |
| 6,713,881 | B2 | 3/2004 | Umehara et al. |
| 7,213,329 | B2 | 5/2007 | Kim et al. |
| 7,449,786 | B2 | 11/2008 | Kawanabe et al. |
| 7,504,728 | B2 | 3/2009 | Ryan |
| 7,687,921 | B2 | 3/2010 | Hiew et al. |
| 7,859,123 | B2 | 12/2010 | Tzu |
| 8,030,098 | B1 | 10/2011 | Liou et al. |
| 8,053,278 | B2 | 11/2011 | Komiyama et al. |
| 8,198,737 | B2 | 6/2012 | Zhang et al. |
| 8,242,594 | B2 | 8/2012 | Wu |
| 8,772,952 | B2 * | 7/2014 | Yasunaga et al. ............ 257/784 |
| 2001/0046715 | A1 | 11/2001 | Takemoto et al. |
| 2002/0158325 | A1 | 10/2002 | Yano et al. |
| 2002/0177296 | A1 | 11/2002 | Ball |
| 2003/0132516 | A1 | 7/2003 | Uchida et al. |
| 2003/0153124 | A1 | 8/2003 | Tomimatsu |
| 2003/0166333 | A1 | 9/2003 | Takahashi |
| 2003/0197289 | A1 | 10/2003 | Lin |
| 2004/0033673 | A1 | 2/2004 | Cobbley et al. |
| 2004/0080056 | A1 | 4/2004 | Lim et al. |
| 2004/0164392 | A1 | 8/2004 | Lee |
| 2004/0256704 | A1 * | 12/2004 | Mathew ........................ 257/678 |
| 2005/0164486 | A1 | 7/2005 | Lua et al. |
| 2005/0191839 | A1 | 9/2005 | Wong et al. |
| 2007/0232054 | A1 | 10/2007 | Yano et al. |
| 2008/0136022 | A1 * | 6/2008 | Filoteo et al. ................. 257/737 |
| 2008/0217786 | A1 * | 9/2008 | Kasaoka et al. ............. 257/773 |
| 2008/0233733 | A1 * | 9/2008 | Lin ................................ 438/617 |
| 2009/0039509 | A1 | 2/2009 | Tanabe et al. |
| 2009/0236756 | A1 | 9/2009 | Kim et al. |
| 2010/0314754 | A1 * | 12/2010 | Zhang et al. .................. 257/737 |

FOREIGN PATENT DOCUMENTS

| | | |
|---|---|---|
| JP | 11-135714 | 5/1999 |
| JP | 2001-338955 A | 12/2001 |
| JP | 2009-043793 A | 2/2009 |

OTHER PUBLICATIONS

Non-Final Office Action issued in U.S. Appl. No. 12/889,023 dated Oct. 25, 2012.

Non-Final Office Action issued in U.S. Appl. No. 12/889,023 dated May 23, 2013.

Final Office Action issued in U.S. Appl. No. 12/889,023 dated Dec. 9, 2013.

Notice of Allowance issued in U.S. Appl. No. 12/889,023 dated Mar. 3, 2014.

* cited by examiner

METHOD OF MANUFACTURING SEMICONDUCTOR DEVICE

CROSS-REFERENCE TO RELATED APPLICATION

This application is a divisional of U.S. patent application Ser. No. 12/889,023, filed Sep. 23, 2010, which claims priority of Japanese Patent Application No. 2009-221116 filed on Sep. 25, 2009, and the contents of which are hereby incorporated by reference.

BACKGROUND OF THE INVENTION

The present invention relates to technology of a semiconductor device and, in particular, to technology effective when applied to a semiconductor device in which a wire made of Cu (copper) is bonded to an electrode pad formed over the main surface of a semiconductor chip.

As a manufacturing technique of a semiconductor device, there is a wire bonding technique in which an electrode pad formed over the main surface of a semiconductor chip and a terminal formed in a wiring substrate or lead frame are electrically coupled via a metal wire. For example, Japanese Patent Laid-Open No. 1999-135714 (Patent Document 1) describes a configuration in which a bump made of gold is formed over an electrode pad by plating and a gold wire is bonded onto the bump.

SUMMARY OF THE INVENTION

It is preferable to use a material having a low electrical resistance for a metal wire that electrically couples an electrode pad of a semiconductor chip and a terminal formed in a wiring substrate or lead frame. Because of this, a wire made of gold is used generally. In recent years, however, the functions of a semiconductor device have been improved and a technique is demanded, which further reduces the impedance of a metal wire.

Hence, the inventors of the present invention have examined a technique that uses a wire made of copper (Cu) having an electrical resistance lower than that of gold (Au) as a metal wire, and found the following problems.

Copper has a still lower electrical resistance compared to that of gold, and thus, is suitable as a material to reduce impedance in a conductive path in a semiconductor device. Copper is however a harder metal (having a higher hardness) compared to gold and when a wire made of Cu is crimped to an electrode pad at the time of wire bonding, the stress at the time of crimping is transmitted to an interlayer insulating film formed on the side of the main surface of a semiconductor chip and there arises such a problem that the interlayer insulating film etc. is broken.

Further, copper is harder to form a thin wire compared to gold and from the viewpoint of reduction in impedance, it is preferable for the wire diameter to have a certain magnitude. When such a copper wire is used in a semiconductor device in which a number of electrode pads are arranged with a narrow arrangement pitch due to the improvement in functions, however, there may be a case where neighboring wires short-circuit.

As described above, if the interlayer insulating film in a semiconductor device breaks or neighboring wires short-circuit, the semiconductor device no longer operates normally and thus its reliability is reduced as a result.

The present invention has been made in view of the above circumstances and provides a technique to improve reliability of a semiconductor device in which wire bonding using a copper wire is performed.

The other purposes and the new feature of the present invention will become clear from the description of the present specification and the accompanying drawings.

The following explains briefly the outline of a typical invention among the inventions disclosed in the present application.

That is, a semiconductor device in one embodiment of the present invention includes: a semiconductor chip having a first main surface, a first back surface located on the opposite side of the first main surface, and a plurality of electrode pads formed over the first main surface; a plurality of first terminals arranged around the semiconductor chip; and a plurality of wires that electrically couple the electrode pads and the first terminals, respectively, wherein the wires are copper wires each having a wire diameter part and a wide width part formed at one of end parts of the wire diameter part and formed so as to have a width greater than that of the wire diameter part, wherein each of the wide width parts of the wires is joined to each of the electrode pads via a bump made of a metal material having a hardness lower than that of copper, and wherein the width of the bump is narrower than that of the wide width part of each of the wires.

The following explains briefly the effect acquired by the typical invention among the inventions disclosed in the present application.

That is, it is possible to improve reliability of a semiconductor device in which wire bonding using a copper wire is performed.

DETAILED DESCRIPTION OF THE PREFERRED EMBODIMENTS

Explanation of Description Form, Basic Term, and Use in the Present Application In the present application, when necessary, explanation of an embodiment is given by dividing the embodiment into a plurality of sections etc., however, except when explicitly stated in particular, the sections are not separated ones mutually independent and regardless of the order of explanation, in respective parts of a single example, one is part of details of another or part or all the rest as a modification example etc. Further, in principle, explanation of resembling part is not given repeatedly. Furthermore, each component in an embodiment is not necessarily indispensable except when explicitly stated in particular or when the number of the components is apparently limited to a specific number theoretically, or when apparently otherwise from the context.

Similarly, in the following embodiments, as to a material, composition, etc., the wording "X including A" etc. does not exclude one having a component other than A as its main component except when explicitly stated in particular or when apparently otherwise from the context. For example, as to a component, the above-mentioned wording means that "X including A as its main component". For example, a "silicon member" etc. is not limited to pure silicon but it is needless to say that members are also included, such as a SiGe (silicon germanium) alloy, a multi-element alloy that includes silicon as its main component, and a member including an additive. Further gold plating, a Cu layer, nickel plating etc., include members having gold, Cu, nickel, etc., as its main component, not only those including pure elements, except when explicitly stated otherwise.

Furthermore, when a specific numerical value or quantity is referred to, except when explicitly stated otherwise in particular or when the number is theoretically limited to a specific number or when explicitly otherwise from the context, the specific number may be greater or less.

Hereinafter, embodiments of the present invention are explained in detail based on the drawings.

First Embodiment

Structure of Semiconductor Device

Figure 1:
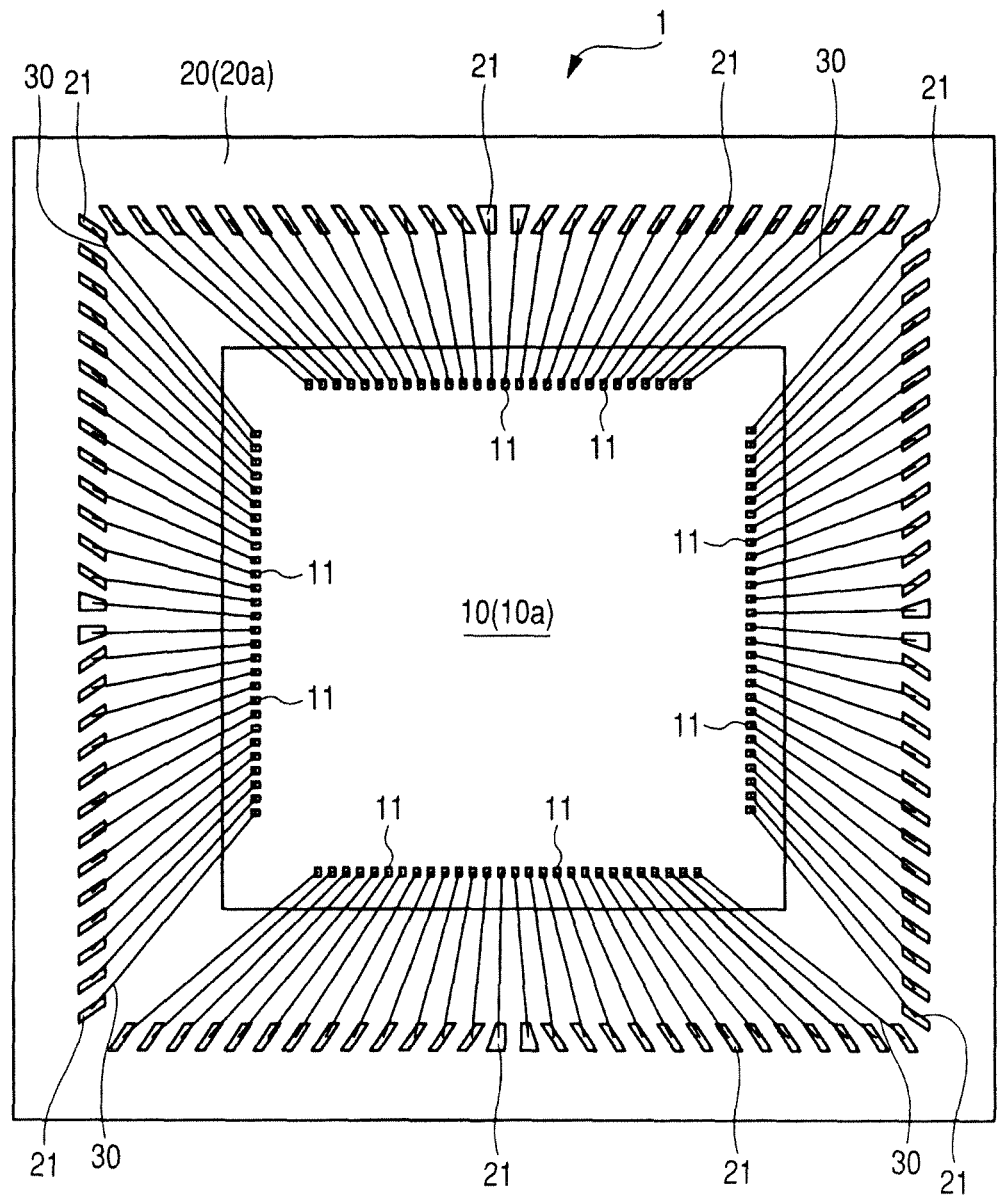
FIG. 1 is a plan view showing an outline of an internal structure of a semiconductor device in a first embodiment of the present invention.
Figure 2:
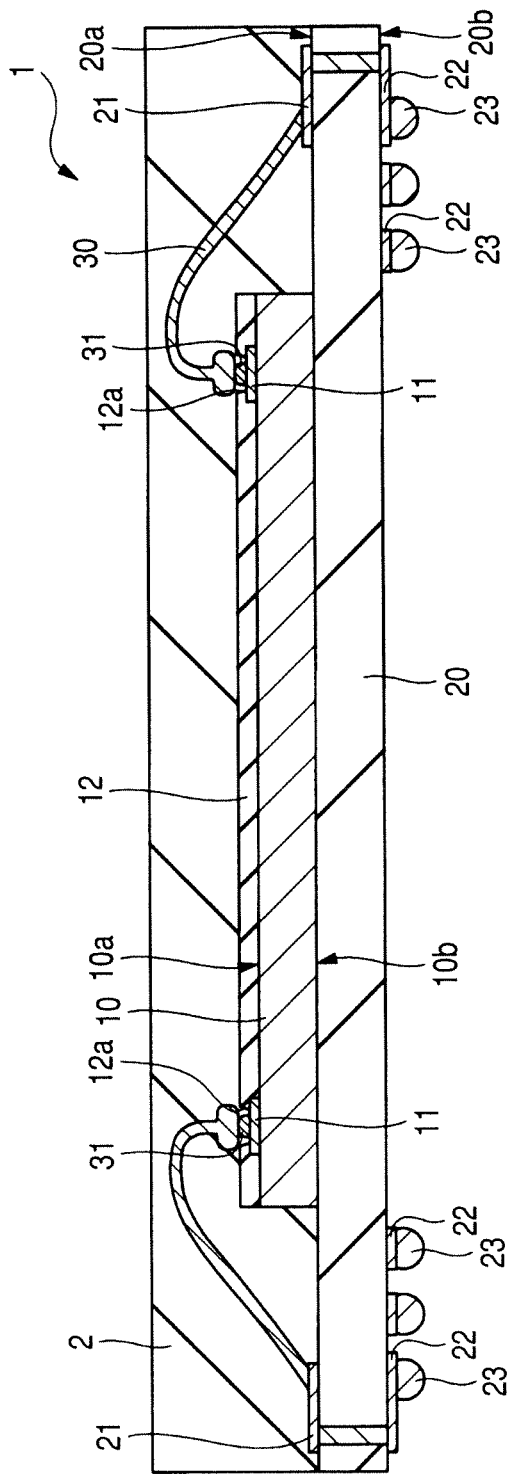
FIG. 2 is a section view of the semiconductor device shown in FIG. 1.
Figure 3:
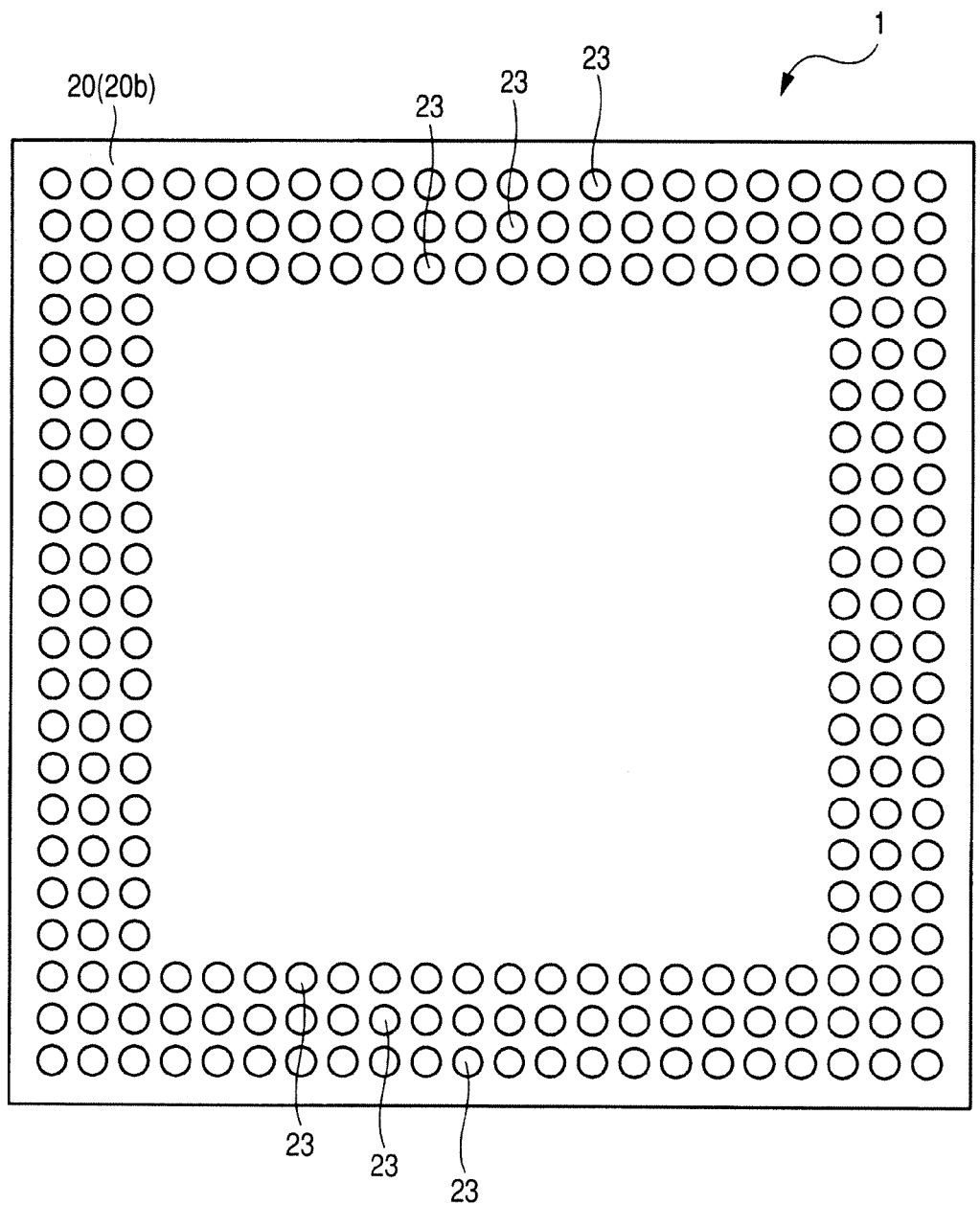
FIG. 3 is a plan view showing the side of an undersurface of the semiconductor device shown in FIG. 1.

FIG. 1 is a plan view showing an outline of an internal structure on the side of a top surface of a semiconductor device in a first embodiment of the present invention, FIG. 2 is a section view of the semiconductor device shown in FIG. 1, and FIG. 3 is a plan view showing the side of an undersurface of the semiconductor device shown in FIG. 1. FIG. 1 shows a state where sealing resin is made transparent in order to show a planar arrangement of the inside of the semiconductor device.

In the present embodiment, explanation is given by way of an example of a CSP (Chip Scale Package) 1, in which a semiconductor chip is packaged face-up over a wiring substrate and a plurality of electrode pads formed over the main surface of the semiconductor chip and a plurality of bonding leads formed around the semiconductor chip over the wiring substrate are electrically coupled via wires, respectively.

In FIG. 1 to FIG. 3, the CSP 1 in the present embodiment has a semiconductor chip 10 having a main surface 10a, a back surface 10b located on the opposite side of the main surface 10a, a plurality of pads (electrode pad) 11 formed over the main surface 10a, and an insulating film 12 formed so as to cover over the main surface 10a and having a plurality of openings 12a formed therein in which the pads 11 are exposed, respectively. In FIG. 1, the insulating film 12 is not shown schematically. The main surface 10a of the semiconductor chip 10 has an external shape of, for example, a rectangle and the pads 11 formed over the main surface 10a are arranged along the respective sides constituting the external shape of the main surface 10a.

The CSP 1 has a wiring substrate (substrate) 20 having atop surface 20a, an undersurface 20b located on the opposite side of the top surface 20a, a chip mounting region arranged in the top surface 20a, and a plurality of terminals (bonding lead) 21 arranged around the chip mounting region (that is, around the semiconductor chip 10).

The chip mounting region arranged in the top surface 20a of the wiring substrate 20 is arranged, for example, in the center of the top surface 20a and the semiconductor chip 10 is mounted by a so-called face-up packaging method, in which the semiconductor chip 10 is fixed on the top surface 20a via an adhesive, not shown schematically, in a state where the back surface 10b and the top surface 20a of the wiring substrate 20 face each other. The terminals 21 are arranged (formed) along the respective sides constituting the external shape of the top surface 20a of the wiring substrate having the external shape of a rectangle. On the undersurface 20b of the wiring substrate 20, a plurality of lands 22, which serve as external terminals of the CSP 1, is formed and the terminals 21 and the lands 22 are electrically coupled via an conductive path, such as a wire and via, formed in the top surface 20a and the undersurface 20b of the wiring substrate 20 and in the wiring substrate 20. Further, the CSP 1 in the present embodiment is a so-called BGA (Ball Grid Array) semiconductor device, in which a solder ball (conductive member, external terminal) 23 to be joined to a terminal of a mounting substrate, not shown schematically, is joined to the surface of the land 22. Arranging external terminals of a semiconductor device on the undersurface 20b of the wiring substrate 20 as described above is preferable from the viewpoint of downsizing the planar dimensions of the semiconductor device, or the viewpoint of reducing the mounting area of the semiconductor device. In an area array semiconductor device, such as a BGA or LGA (Land Grid Array) semiconductor device, in which external terminals are aligned and arranged in a plurality of rows in an external terminal formation area on the undersurface 20b of the wiring substrate 20, even when the number of external terminals increases accompanying the improvement of functions of a semiconductor device, the undersurface 20b can be used effectively as an external terminal arrangement space, and thus, the area array semiconductor device is particularly effective from the viewpoint of downsizing and reducing the mounting area when applied to a semiconductor device with a large number of external terminals.

The terminals 21 arranged around the semiconductor chip 10 and the pads 11 formed over the main surface 10a of the semiconductor chip 10 are electrically coupled via a plurality of wires 30, respectively. The side of the top surface 20a of the wiring substrate 20 is covered with a sealing resin (sealing body) 2 and the semiconductor chip 10 and the wires 30 are sealed with the sealing resin 2.

Figure 4:
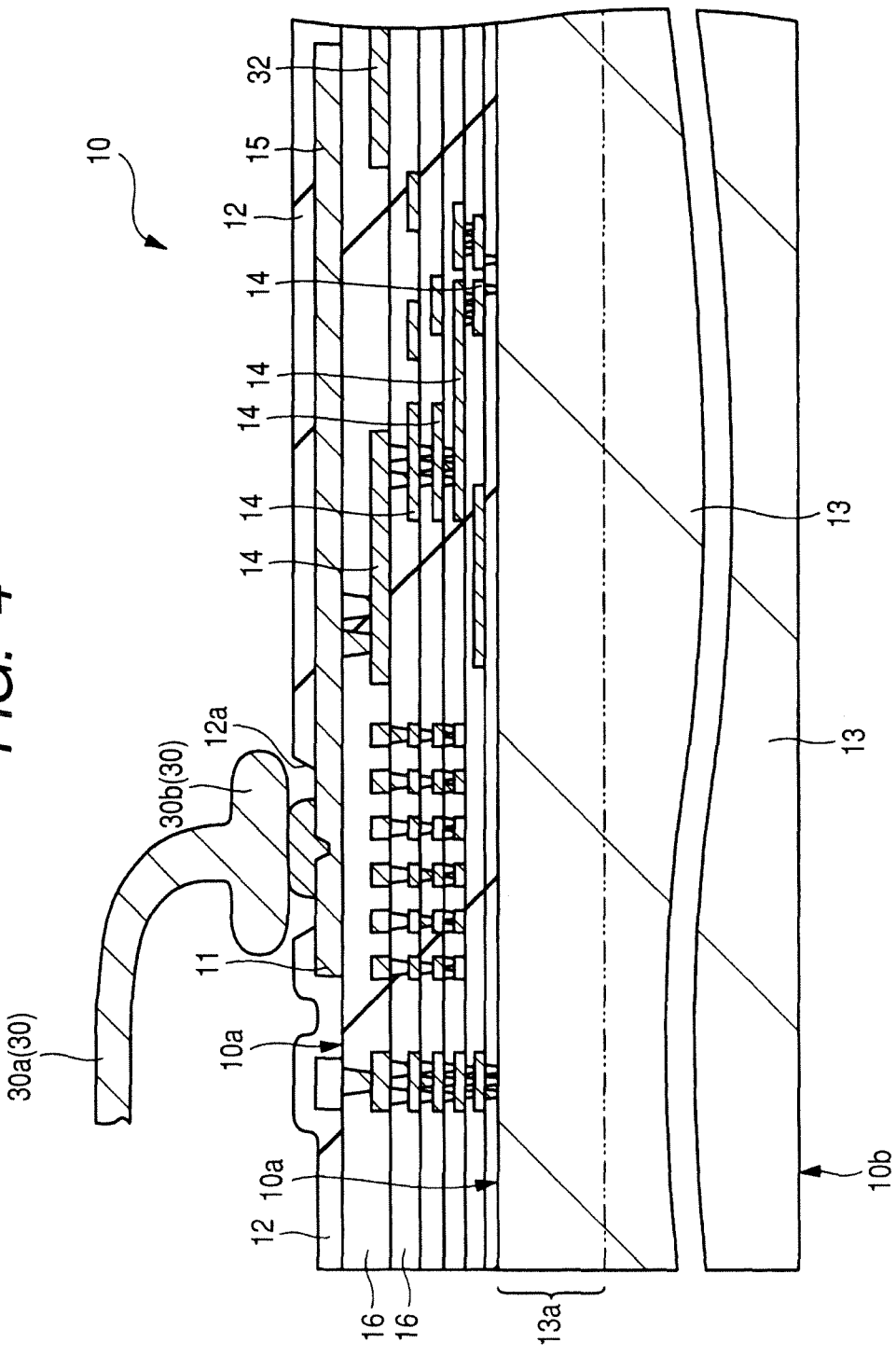
FIG. 4 is an enlarged section view of essential parts showing an outline of a structure of a semiconductor chip shown in FIG. 2.
Figure 5:
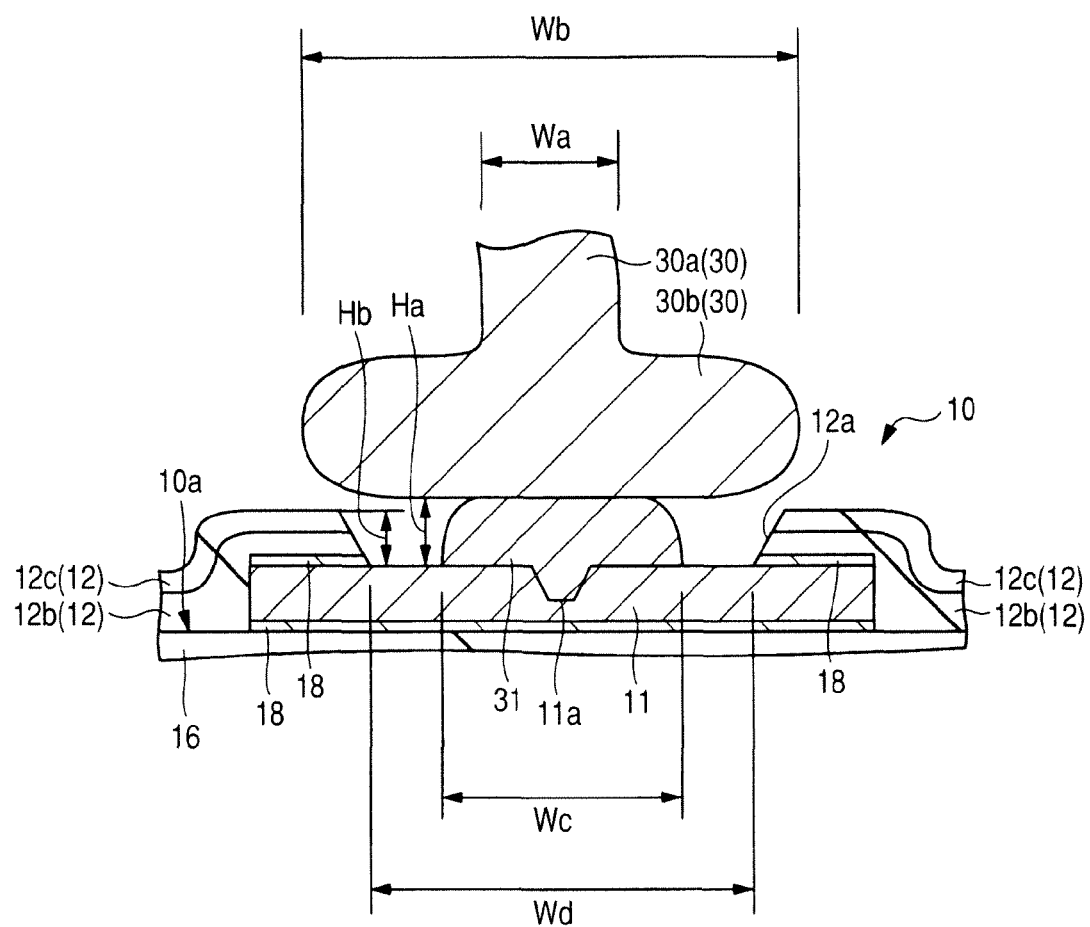
FIG. 5 is an enlarged section view of essential parts showing the periphery of a pad shown in FIG. 2.
Figure 6:
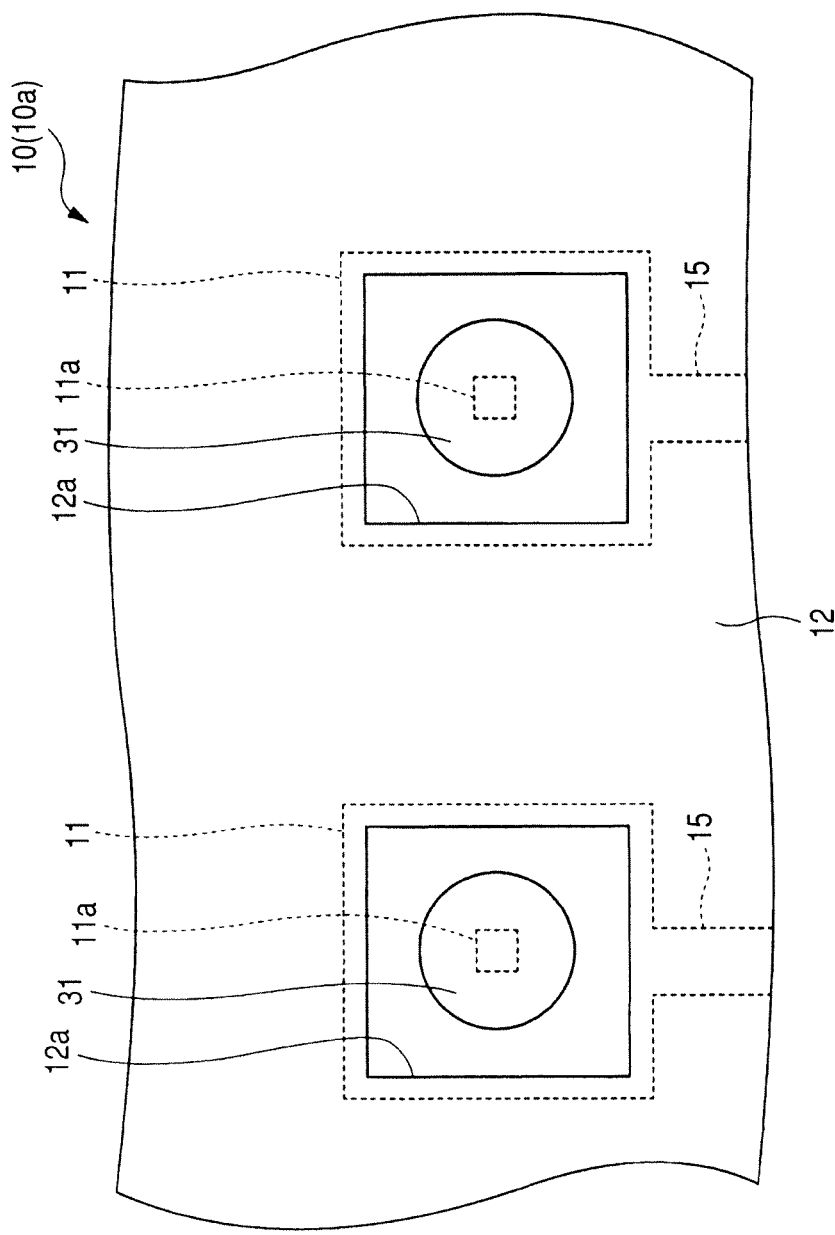
FIG. 6 is an enlarged plan view of essential parts showing the periphery of the pad of the semiconductor chip shown in FIG. 1 in a state where wires are removed.
Figure 7:
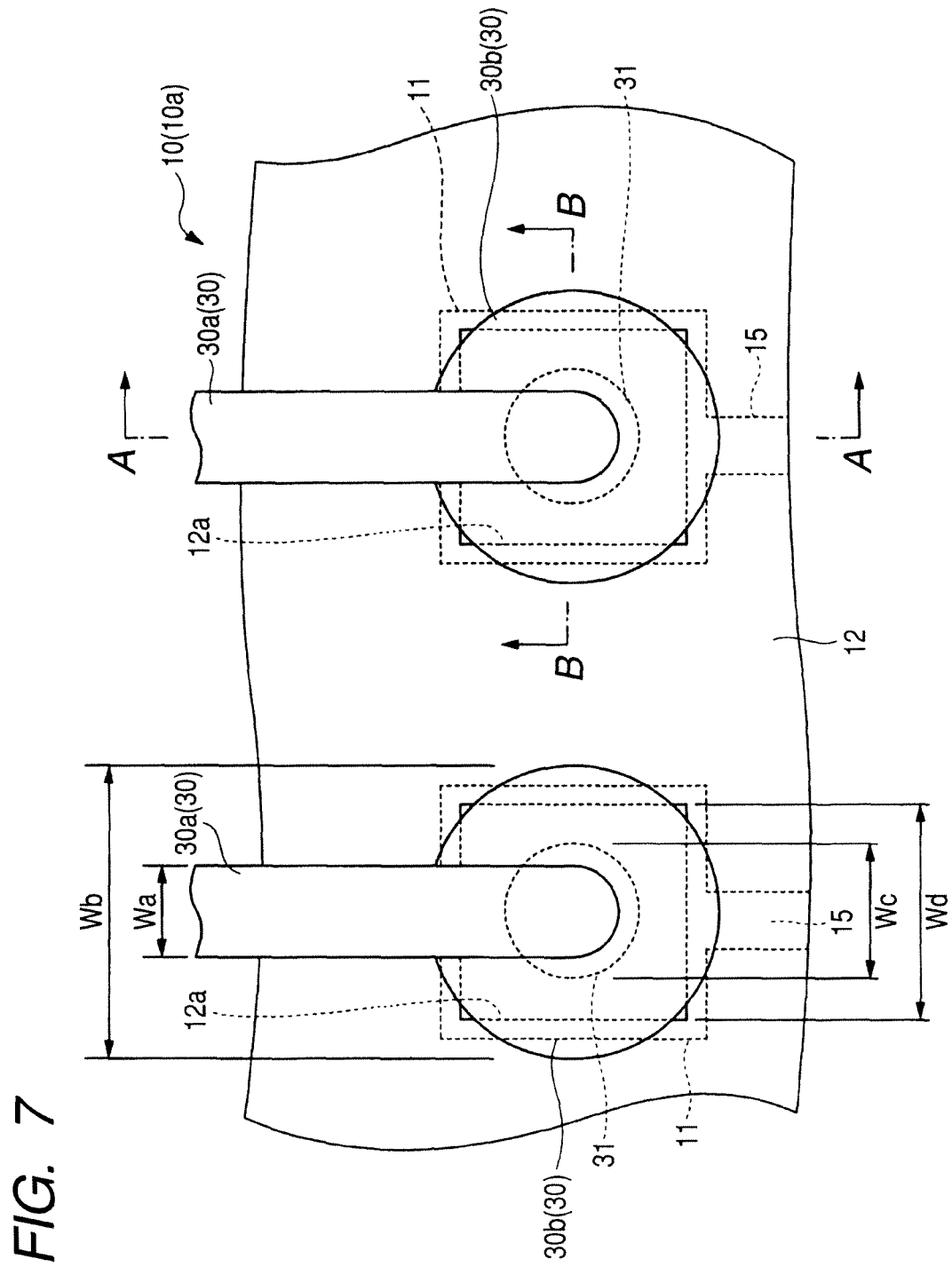
FIG. 7 is an enlarged plan view of essential parts showing a state where a wire is joined to a bump shown in FIG. 6.

Next, a detailed structure of the periphery of the pad 11 of the semiconductor chip 10 is explained. FIG. 4 is an enlarged section view of essential parts showing an outline of the semiconductor chip shown in FIG. 2 and FIG. 5 is an enlarged section view of essential parts showing the periphery of the pad shown in FIG. 2. FIG. 6 is an enlarged plan view of essential parts showing the periphery of the pad of the semiconductor chip shown in FIG. 1 in the state where wires are removed, and FIG. 7 is an enlarged plan view of essential parts showing the state where the wire is joined to the bump shown in FIG. 6. FIG. 4 shows a section along A-A line shown in FIG. 7 and FIG. 5 shows a section along B-B line shown in FIG. 7, respectively.

The semiconductor chip 10 has a semiconductor substrate 13, which is a base material including, for example, silicon (Si), and over the main surface 10a of the semiconductor substrate 13, a semiconductor element layer 13a is disposed and in the semiconductor element layer 13a, for example, a plurality of semiconductor elements, such as a transistor and diode, is formed.

The semiconductor elements formed in the semiconductor element layer 13a are electrically coupled to the pads 11, respectively, via a plurality of wires (in-chip wire) 14 formed over the main surface 10a and surface wires 15 formed over the main surface 10a.

The wire 14 is, for example, an embedded wire including copper (Cu) and formed by the so-called damascene technique, in which a groove or a hole is formed in an insulating layer 16 formed on the side of the main surface 10a and after a conductive metal material, such as copper, is embedded in the groove or hole, the surface thereof is polished and thus a wire is formed. The wire 14 is formed into a laminated layer of a plurality of wiring layers and the wire 14 in each wiring layer is electrically coupled to another via a via that serves as an interlayer conductive path. Further, the wire 14 electrically couples the semiconductor elements or electrically couples the semiconductor elements to the respective pads 11 to form a circuit, and in order to secure a space to route the wire path, the wire is laminated into a plurality of layers via the insulating layers 16.

The insulating layer 16, which is an interlayer insulating film disposed between the respective wires 14 of the respective wiring layers is, for example, an insulating layer including a semiconductor compound, such as silicon oxide ($SiO_2$). From the viewpoint of improving the adhesion with the semiconductor substrate 13, which is a base material, it is preferable to use a semiconductor compound.

It is also possible to use a low dielectric constant material, a so-called low-k material, in addition to $SiO_2$. In recent years, accompanying the improvement in the degree of integration of an integrated circuit formed in a semiconductor chip (semiconductor device), it becomes more important to prevent noise that occurs in the circuit formed in the semiconductor chip. This noise occurs when parasitic capacitance occurs between the wires 14 laminated into a multilayer or between the wire 14 and the semiconductor element. Consequently, from the viewpoint of reducing the parasitic capacitance, it is preferable to use the insulating layer 16 including a low dielectric constant material having the dielectric constant lower than that of $SiO_2$, as an interlayer insulating film to be disposed between the wires 14 of the respective wiring layers. Such a low dielectric constant material includes, for example, SiOC, SiOF, SiCN, $SiO_2$ containing a methyl group, MSQ (Methyl Silses Quioxane), etc. The insulating layers including these low dielectric constant materials each have a dielectric constant lower than that of the insulating layer including $SiO_2$ (specific permittivity is about 3.9 to 4). Because of this, it is possible to prevent or suppress the parasitic capacitance from occurring between the wires 14 arranged in the respective wiring layers. That is, it is possible to prevent or suppress the occurrence of noise.

The top surface 10a of the semiconductor chip 10 refers to a surface from the surface over which the semiconductor elements are formed to the surface over which the pad 11 is formed, that is, to the top surface of the insulating layer 16 laminated in the uppermost tier of the insulating layer 16 laminated into a multilayer. Consequently, the surface over which the semiconductor element layer 13a in which the semiconductor elements are formed and over which the wires 14 laminated over the semiconductor element layer 13a via the insulating layers 16 and electrically coupled to the semiconductor elements are formed is included in the main surface 10a.

Over the main surface 10a, the pad 11 and the surface wire 15 formed integrally with the pad 11 and electrically coupling the pads 11 and the semiconductor elements, respectively, via the wires 14 are formed. The pad 11 and the surface wire 15 include, for example, aluminum (Al) (in detail, there is a case where aluminum (Al) includes impurity, such as copper (Cu) and silicon (Si)), and are covered with the insulating film (surface insulating film) 12, which serves as a passivation film that protects the main surface 10a. The insulating film 12 serves as a protective film that protects the main surface 10a of the semiconductor chip 10, and therefore, it is preferable to use a material that is hard to peel off from the insulating layer 16 and hard to be destroyed by impact etc. Consequently, the insulating film 12 includes, for example, semiconductor oxide, such as SiO$_2$, or semiconductor nitride, such as SiN, or a laminated film of these materials. FIG. 5 shows an example of a structure in which a SiN film 12c is laminated over a SiO$_2$ film 12b. From the viewpoint of improving the adhesion between the pad 11 and the surface wire 15 including aluminum and the insulating layer 16 or the insulating film 12, a conductive film 18 including, for example, titanium nitride (TiN) as shown in FIG. 5, is formed between the pad 11, the surface wire 15, and the insulating layer 16 and between the pad 11, the surface wire 15, and the insulating film 12.

Over the main surface 10a of the semiconductor chip 10, in the surface (surface located on the opposite side of the surface in opposition to the main surface 10a) of the pad 11, the opening 12a is formed in the insulating film 12 and the pad 11 is exposed from the conductive film. 18 formed over the insulating film 12 and the pad 11 in the opening 12a. The opening 12a is formed by, for example, photo etching, and at this time, by covering the pad 11 including aluminum with titanium nitride, it is possible to suppress reflection of light, and thus, it is possible to form the opening 12a with precision. The pad 11 is electrically coupled to the wire 30 joined onto the opening 12a and thereby the conduction with the outside of the semiconductor chip 10 is secured.

The wire 30 is a thin metal wire that electrically couples the pad 11 and the terminal 21 shown in FIG. 2, and hence, it is preferable to use a material having a lower electrical resistance from the viewpoint of reducing impedance. Because of this, in general, a gold wire is used as a thin metal wire. In recent years, however, the functions of a semiconductor device are improved and a technique to further reduce the impedance of a metal wire is demanded.

Hence, in the present embodiment, as the wire 30, copper is used, which has an electrical resistance further lower than that of gold (Au). Copper has an electrical resistance lower than that of gold, and thus, it is possible to reduce the impedance of the conductive path from the pad 11 to the terminal 21 shown in FIG. 2.

Since copper is a metal harder than gold (hardness is higher), however, when the wire 30 made of copper is crimped to the pad 11 at the time of wire bonding, the stress at the time of crimping is transmitted to the insulating layer 16, which is an interlayer insulating film formed on the side of the main surface 10a of the semiconductor chip 10, and there may be a case where the insulating layer 16 is broken. In particular, when the above-mentioned low dielectric constant material is used as the insulating layer 16, the lower dielectric constant material is more vulnerable compared to the insulting layer including SiO$_2$, and thus, it becomes more likely to be broken at the time of wire bonding. Further, in recent years, from the viewpoint of downsizing a semiconductor chip with high performance by effectively making use of the space on the side of the main surface 10a of the semiconductor chip 10, there is a case where a so-called PAA (Pad on Active Area) technique is applied, in which a semiconductor element is formed at a position that overlaps the pad 11 in the direction of thickness. When a semiconductor element is formed at a position that overlaps the pad 11 in the direction of thickness, there is a case where the semiconductor element or the wire 14 coupled thereto is broken accompanying the breakage of the insulating layer 16 and thus the semiconductor chip 10 is broken and its reliability is reduced.

Hence, in the present embodiment, a bump 31 made of a metal material softer than copper (hardness is low) is formed between the wire 30 and the pad 11 and the wire 30 and the pad 11 are joined via the bump 31. As a metal material used to configure the bump 31, for example, gold (Au), palladium (Pd), platinum (Pt), silver (Ag), lead (Pb)-tin (Sn) alloy, tin (Sn), etc., are exemplified, however, in the present embodiment, the bump 31 made of gold is used from the viewpoint that processing is easy and the gold wire bonding technique that has been accumulated hitherto can be applied.

As described above, the bump 31 made of gold having the hardness lower than that of copper is formed over the pad 11 and the wire 30 made of copper is joined to the bump 31, and thereby, it is possible to relax the stress to be applied to the semiconductor chip 10 at the time of wire bonding by the bump 31. Because of this, even when the wire 30 made of copper is used, it is possible to prevent or suppress the breakage of the insulating layer 16, and thus, it is possible to improve the reliability of the CSP 1.

In the wire bonding step in which the wire 30 is electrically coupled to the bump 31, one of the end parts of the copper wire is melted into the shape of a sphere and this is pressed and crimped to the bump 31. Because of this, the joined wire 30 has a wire diameter part 30a and a wide width part 30b formed at one of the end parts of the wire diameter part 30a and formed with a width greater than that of the wire diameter part 30a as shown in FIG. 4 and FIG. 5, and the wide width part 30b and the bump 31 are joined.

In the present embodiment, from the viewpoint of reducing the impedance of the wire 30, a copper wire is used. The impedance decreases in proportion to the wire diameter of the wire 30, and thus, it is preferable for the wire diameter of the wire 30 to be greater. Copper is harder to form a thin wire compared to gold and if the copper wire is thinned extremely, breakage etc. occurs, resulting in the reduction in manufacturing efficiency and reliability. Hence, it is preferable to increase the wire diameter of the wire 30 also from the viewpoint of improving the manufacturing efficiency and reliability. In the present embodiment, a wire with a wire diameter of, for example, about 25 μm or more and 50 μm or less is used. A width Wa of the wide width part 30b of the wire 30 is roughly regulated by the wire diameter of the wire diameter part 30a (width Wa of the wire diameter part 30a) and when, for example, the wire diameter of the wire diameter part 30a is 25 μm, a width Wb is about 40 μm and when the wire diameter of the wire diameter part 30a (width Wa of the wire diameter part 30a) is 50 μm, the Wb is about 80 μm.

Here, when the copper wire 30 having a great wire diameter is bonded, there may be a case where the width Wb of the wide width part 30b of the wire 30 is greater than a width (opening width) Wd of the opening 12a. When the wire 30 having the wide width part 30b with a width greater than the width Wd of the opening 12a is joined to the pad 11 directly, as described above, there is a possibility that the end part of the wide width part 30b interferes with the insulating film 12 on the periphery of the opening 12a and the joint strength is reduced. Further, in order to join the wire 30 and the pad 11 firmly, it is necessary to apply a very strong external force to press the wide width part 30b of the wire 30 against the pad 11 and the risk of the breakage of the semiconductor chip 10 increases. On the other hand, the insulating film 12 is a protective film that protects the main surface 10a of the semiconductor chip 10 and from the viewpoint of improving reliability, it is preferable to reduce the opening area of the opening 12a as small as possible.

Hence, in the present embodiment, the bump 31 is formed so that a width Wc of the bump 31 is narrower than the wide width part 30b of the wire 30. Further, in the present embodiment, the width Wc of the bump 31 is narrower than the width Wd of the opening 12a. As shown in FIG. 5, a height Ha of the bump 31 is greater than the height of the insulating film 12 over the pad 11, that is, a height Hb of the opening 12a. Accordingly, even when the opening area of the opening 12a is reduced, it is possible to firmly join the bump 31 and the pad 11, and the bump 31 and the wire 30, respectively. In other words, it is possible to reduce the opening area while suppressing the reduction in joint strength. Even when the height Ha of the bump 31 is somewhat less than the height Hb of the opening 12a, it is possible to improve the joint properties because the difference in height between the surface of the pad 11 and the insulating film 12 that covers the pad 11 can be reduced. From the viewpoint of the firm joint, however, it is preferable to make the height Ha greater than the height Hb.

Figure 26:
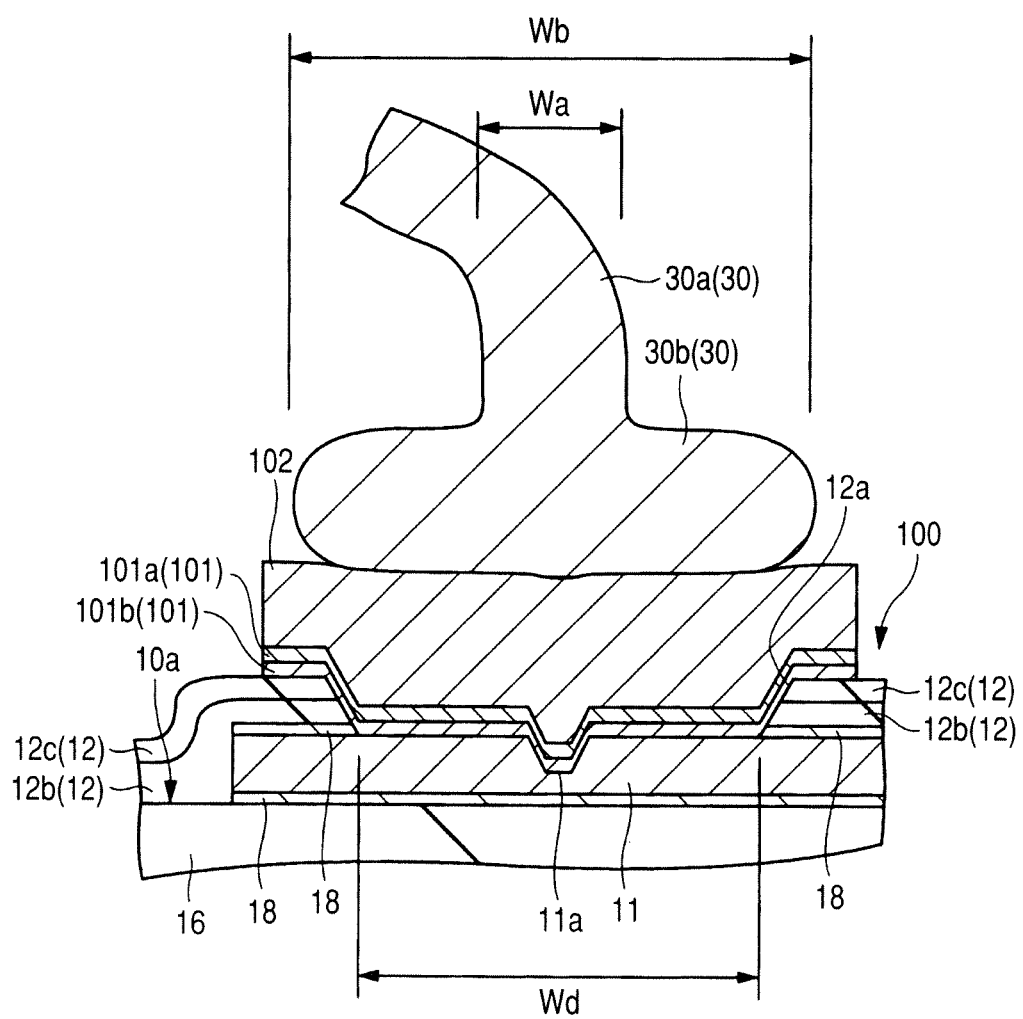
FIG. 26 is an enlarged section view of essential parts showing the periphery of a pad of a semiconductor chip of a semiconductor device, which is a comparative example to the first embodiment of the present invention.

The bump 31 in the present embodiment is a so-called stud bump that is formed by crimping a metal member constituting the bump 31 onto the surface of the pad 11 to be joined. For example, the bump 31 in the present embodiment is formed by melting the end part of the wire made of, for example, gold into the shape of a sphere and cutting unnecessary wires after crimping the molten sphere onto the surface of the pad 11 by applying the wire bonding technique. It is also conceived to use a so-called plated bump in which a metal film is formed by the electrolytic plating method as a kind of bump to be formed over the pad 11, in addition to the use of the stud bump as in the present embodiment. From the following viewpoint, however, it is preferable to use a stud bump as the bump 31. FIG. 26 is an enlarged view of essential parts showing the periphery of the pad of the semiconductor chip of the semiconductor device, which is a comparative example to the present embodiment.

A point of difference between the semiconductor device in the comparative example shown in FIG. 26 and the semiconductor device in the present embodiment shown in FIG. 5 is that the bump of a semiconductor chip 100 is a bump formed by the electrolytic plating method. As shown in FIG. 26, in order to perform electrolytic plating, it is necessary to form a thin metal film 101 as a seed film to supply a potential. The thin metal film 101 includes, for example, a copper film 101a including, for example, copper excellent in joint properties with gold, and a titanium film 101b formed in the underlayer of the copper film 101a and including titanium excellent in joint properties with copper and aluminum. A plated bump 102 is formed over the thin metal film 101. That is, the plated bump 102 is joined onto the pad 11 via over the thin metal film 101.

Here, in FIG. 5 and FIG. 26, part of the surface of the pad 11 is recessed. That is, the surface of the pad 11 (within the opening 12a) has a recess part 11a. The recess part 11a is a trace (hereinafter, referred to as a probe trace) formed when a contact terminal for inspection (hereinafter, referred to as a probe) is pressed in the inspection step to be performed in the manufacturing stage of a semiconductor chip. From the viewpoint of improving the manufacturing efficiency in the manufacturing step of a semiconductor device, it is preferable to reduce wasteful time and work to process a defective product that cannot be repaired by detecting and identifying a semi-finish product in which a product fault has occurred in a stage as earlier as possible.

Hence, in the manufacturing step of the semiconductor chip 10, an electrical test is conducted in order to confirm that semiconductor elements and wires are formed correctly over the main surface 10a and predetermined electrical characteristics can be obtained in the stage of wafer process before, for example, the semiconductor chip 10 is individualized. In this electrical test, a probe for inspection is pressed against the surface of the pad 11 and electrically coupled thereto. At this time, in order to conduct the test correctly, it is necessary to cause the probe and the pad 11 to come into contact with each other securely, and thus, the probe is pressed with a comparatively strong force. As a result, in the surface of the pad 11 after the electrical test is completed, the recess part 11a that is recessed locally deep is formed as shown in FIG. 5 and FIG. 26.

If a local recess is formed in the surface of the pad 11, however, such as the recess part 11a, it becomes difficult to stably form the thin metal film 101 and the plated bump 102. In particular, since the thin metal film 101 is formed as a seed film to supply a potential in the plating step, it is preferable to form it as thin as possible from the viewpoint of causing the plated bump 102 to exhibit the stress relaxing function, however, if part of the surface of the pad 11 is recessed, it becomes difficult to form the film with a uniform thickness. Further, there is a concern that the joint strength is reduced partially resulting from the presence of the recess part 11a at each joint interface of the plated bump 102, the thin metal film 101, and the pad 11.

On the other hand, the bump 31 in the present embodiment shown in FIG. 5 is a stud bump, as described above, and thus, the bump 31 is joined directly to the pad 11 by thermal crimping. Because of this, as shown in FIG. 5, even when the recess part 11a exists, it is possible to firmly join the bump 31 to the region around the recess part 11a whether the bump 31 is embedded in the recess part 11a or not. That is, in the present embodiment, by using the bump 31 as a stud bump, it is possible to firmly join the bump 31 and the pad 11 even when the recess part 11a, such as a probe trace, exists in the surface of the pad 11, and thus, the electrical coupling reliability can be improved.

<Manufacturing Method of Semiconductor Device>

Next, a manufacturing method of the CSP1 shown in FIG. 1 to FIG. 3 is explained.

A manufacturing method of a semiconductor device in the present embodiment includes a semiconductor chip preparing step for preparing a semiconductor chip, a die bonding step for mounting a semiconductor chip over a wiring substrate, a wire bonding step for electrically coupling a plurality of pads formed over the main surface of a semiconductor chip and a plurality of terminals formed around the semiconductor chip in the semiconductor mounting surface of the semiconductor chip of the wiring substrate via a plurality of wires, a sealing step for sealing with resin the semiconductor chip and the wire, and a individualizing step for obtaining a plurality of semiconductor devices by dividing the wiring substrate.

The semiconductor chip preparing step includes a semiconductor wafer preparing step for preparing a semiconductor wafer having a plurality of device regions, an electrical test step for confirming the electrical characteristics of a semiconductor element formed in the device region by pressing a probe against the pads formed in the device region (hereinafter, referred to as a probe inspection step), a bump forming step for joining the bumps over the exposed surface of the pads, respectively, and a dicing step for obtaining a plurality of semiconductor chips by cutting the semiconductor wafer along a scribe region. The steps are explained below in order.

Figure 8:
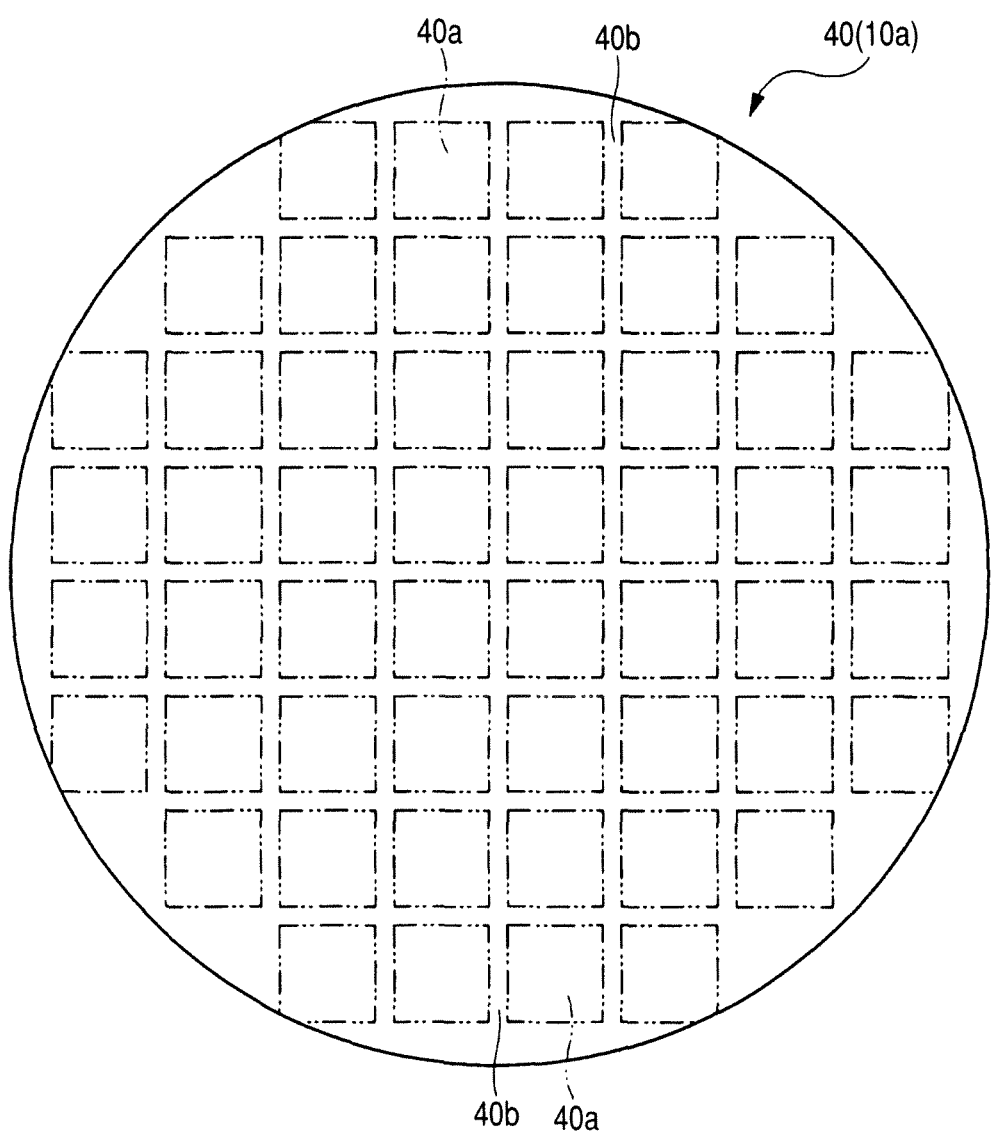
FIG. 8 is a plan view showing a plane on the side of the main surface of a semiconductor wafer to be prepared in a wafer preparing step in the first embodiment of the present invention.
Figure 9:
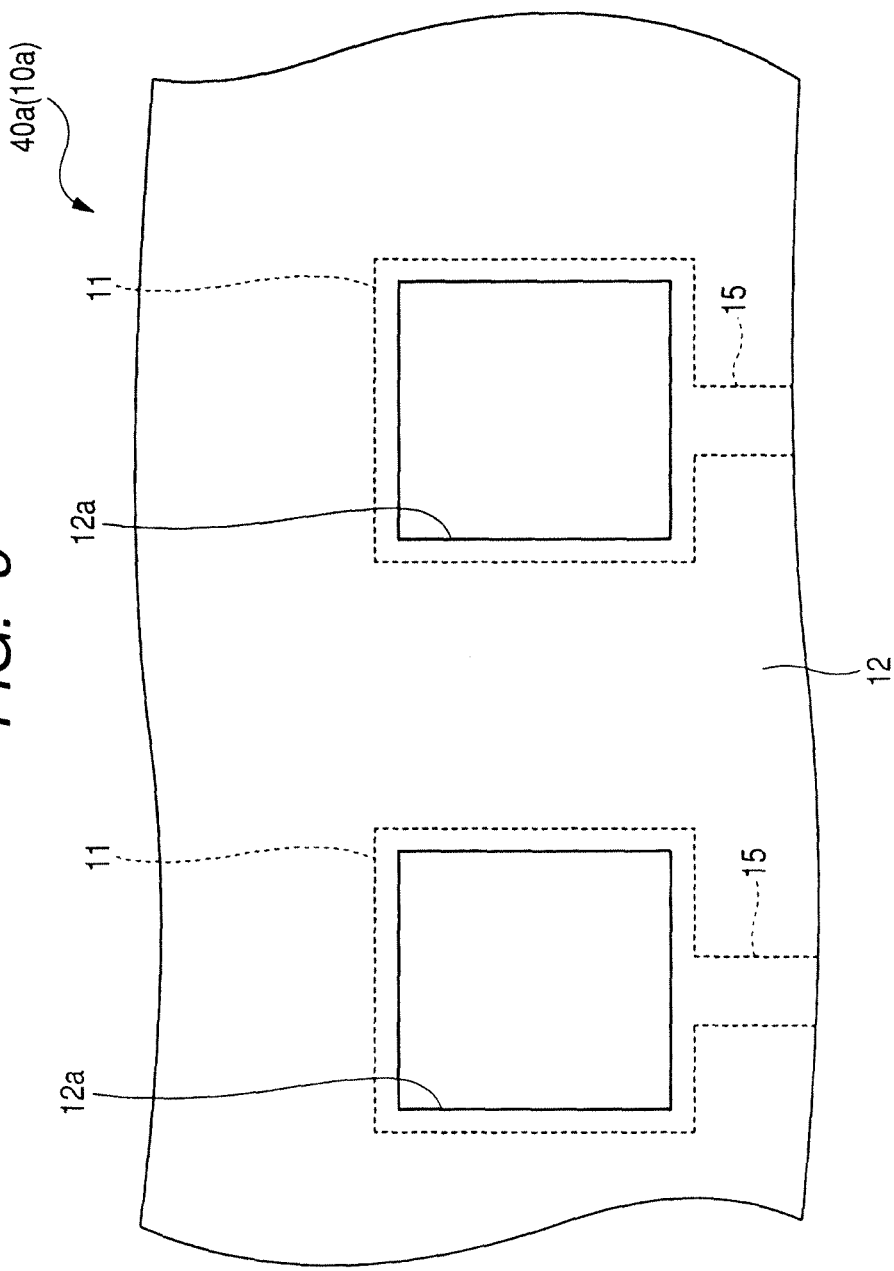
FIG. 9 is an enlarged plan view showing the periphery of a pad formed in one of device regions of the wafer shown in FIG. 8.

First, in the wafer preparing step, a wafer (semiconductor wafer) 40 shown in FIG. 8 is prepared. FIG. 8 is a plan view showing a plane on the side of the main surface of a semiconductor wafer prepared in the wafer preparing step in the present embodiment and FIG. 9 is an enlarged plan view showing the periphery of a pad formed in one of the device regions of the wafer shown in FIG. 8.

The wafer 40 to be prepared in the present embodiment has the main surface 10a having the planar shape of substantially a circle and a back surface, not shown schematically, located on the opposite side of the main surface 10a. The main surface 10a of the wafer 40 corresponds to the main surface 10a of the semiconductor chip 10 explained using FIG. 4.

The wafer 40 further has a plurality of device regions 40a, which are arranged in a matrix in the main surface 10a of the wafer 40. Each device region 40a corresponds to the semiconductor chip 10 shown in FIG. 4 to FIG. 7. In the device regions 40a, a semiconductor element of the semiconductor chip 10, the wire 14, the insulating layer 16, the pad 11, the surface wire 15, and the insulating film 12 are formed. In the previous stage of the probe inspection step, the surface of the pad 11 is substantially flat as shown in FIG. 9.

Between the neighboring device regions 40a of the device regions 40a, a scribe region 40b is formed. The scribe region 40b is formed into a grid shape and divides over the main surface 10a of the wafer 40 into the device regions 40a. In the scribe region 40b, a plurality of test patterns (not shown schematically) called TEG (Test Element Group) is formed. The TEG is a pattern used in the test to confirm whether or not the semiconductor element and the wire to be formed in the device region 40a are formed correctly and is cut off from the device region 40a when the scribe region 40b is cut in the dicing step, to be described later.

Figure 10:
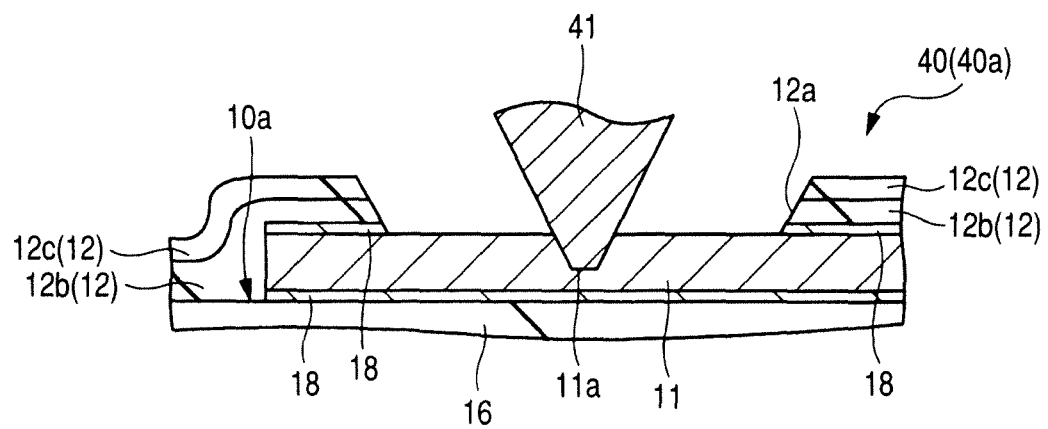
FIG. 10 is an enlarged section view of essential parts showing a state where a probe is pressed against the surface of the pad shown in FIG. 9.
Figure 11:
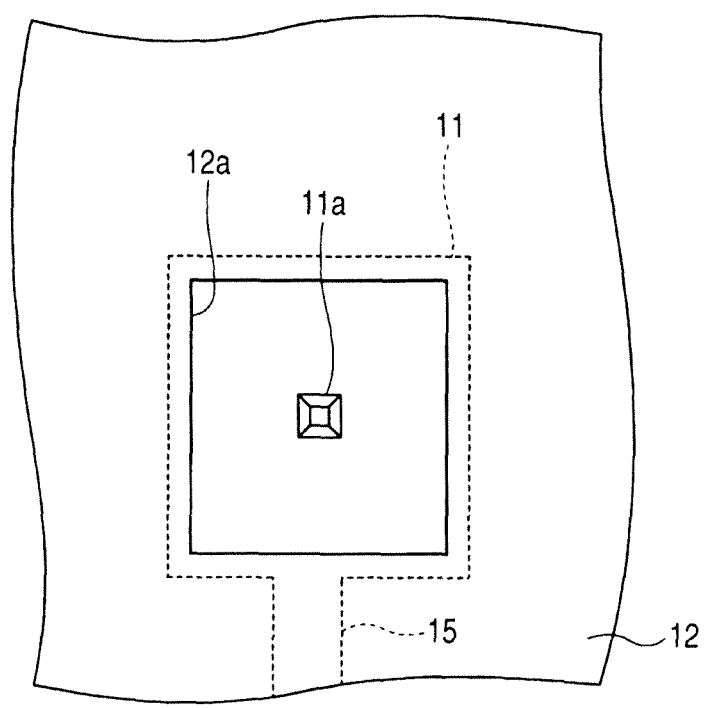
FIG. 11 is an enlarged plan view of essential parts showing a state of the surface of the pad after the probe shown in FIG. 10 is separated.

Next, in the probe inspection step, the electrical characteristics of the integrated circuit including the semiconductor element formed in the main surface 10a of the device region 40a are confirmed. FIG. 10 is an enlarged section view of essential parts showing a state where a probe is pressed against the surface of the pad shown in FIG. 9, and FIG. 11 is an enlarged plan view of essential parts showing a state of the pad surface after the probe shown in FIG. 10 is separated. In this step, as shown in FIG. 10, a probe (contact terminal) 41 for inspection to be electrically coupled to a test equipment (not shown schematically) is pressed against the surface of the pad 11 and electrically coupled thereto. Because of this, during the period of measurement of the electrical characteristics, the probe 41 and the pad 11 need to be in contact with each other securely. Further, in the present step, a plurality of the probes 41 is caused to come into contact with the pads 11, respectively, at the same time, and thus the electrical characteristics are inspected (in FIG. 10, one of the probes 41 and one of the pads 11 are shown in an enlarged view). Because of this, it is preferable to make the same the contact resistance of each contact part of the probe 41 and the pad 11 to accurately conduct the test. Consequently, in the present step, the probe 41 is pressed against the pad 11 with a pressing force as strong as to cause the tip end of the probe 41 to come into the pad 11 and then measurement is made. As a result, in the surface of the pad 11 after the probe 41 is separated, the recess part 11a that is recessed locally and having the shape resembling that of the tip end of the probe 41 (refer to FIG. 10) is formed as shown in FIG. 11. From the viewpoint of causing the probe 41 to come into contact with the inside of the opening 12a securely, it is preferable to cause the tip end of the probe 41 to come into contact in such a positional relationship that it comes into contact with substantially the center of the opening 12a. This is because even if the position of the tip end of the probe 41 is shifted somewhat because of the processing precision or alignment precision, it is possible to cause the tip end to come into contact with the pad 11.

Figure 12:
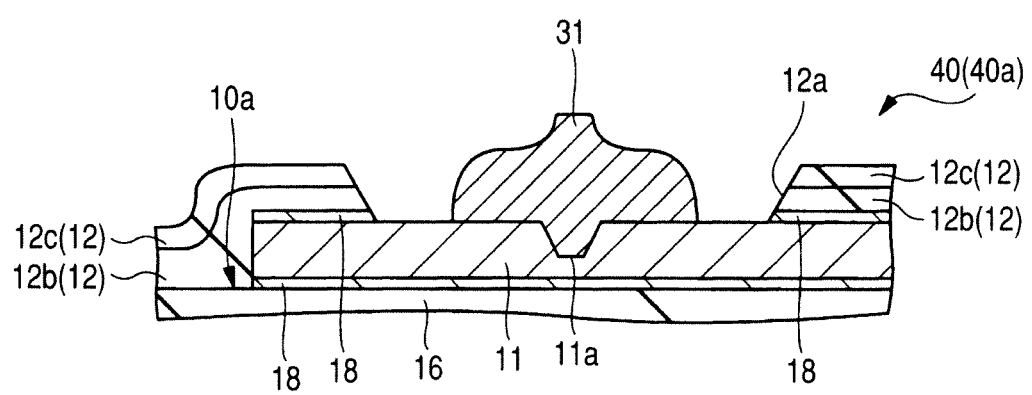
FIG. 12 is an enlarged section view of essential parts showing a state where a bump is joined to the surface of the pad shown in FIG. 10.

Next, in a bump forming step, the bump 31 shown in FIG. 5 is joined to the surface of the pad 11. FIG. 12 is an enlarged section view of essential parts showing a state where the bump is joined to the surface of the pad shown in FIG. 10. In the present step, the bumps 31 are crimped over the pads 11 formed in the device region 40a determined to be a conforming item in the above-mentioned probe inspection step and they are joined, respectively (FIG. 12 shows one of the bumps 31 and one of the pads 11 in an enlarged view). In the present step, the bump 31 is formed by applying the wire bonding technique, in which the end part of the wire made of, for example, gold is melted into the shape of a sphere and after it is crimped to the surface of the pad 11, unnecessary wires are cut. By forming the bump 31 using a material more excellent in processability than copper, such as gold, the width Wb of the bump 31 can be reduced, and thus, it is possible to form the bump 31 within the opening 12a even if the width Wd of the opening 12a is reduced. Hence, it is possible to join the joint interface of the bump 31 and the pad 11 firmly. If the width Wb of the bump 31 is reduced narrower than the width Wd of the opening 12a, the surface of the pad 11 is brought into a state where part thereof (in detail, part around the region that is joined to the bump 31) is exposed from the bump 31 within the opening 12a.

In the present embodiment, an aspect in which the bump forming step is performed before the wafer is individualized (dicing step), that is, the bump 31 is formed in the wafer process is explained. If the bump 31 is formed in the wafer process as described above, it is possible to form the bump 31 in the state where the wafer is fixed on the stable working stage, and thus, this is preferable compared to the case where the bump 31 is formed after the semiconductor chip is mounted over the wiring substrate from the viewpoint of the processing precision or the working efficiency. The timing at which the bump 31 is formed is however only required to be before the wire bonding step, to be described later, and for example, it is also possible to form the bump 31 after the dicing step or after the die bonding step, to be described later.

Next, in the dicing step, the wafer 40 in the shape of substantially a circle shown in FIG. 8 is cut along the scribe region 40b and the semiconductor chips 10 are obtained. In the present step, the wafer 40 is cut by running, for example, a cutting jig (not shown schematically), called a dicing blade along the scribe region 40b.

Figure 13:
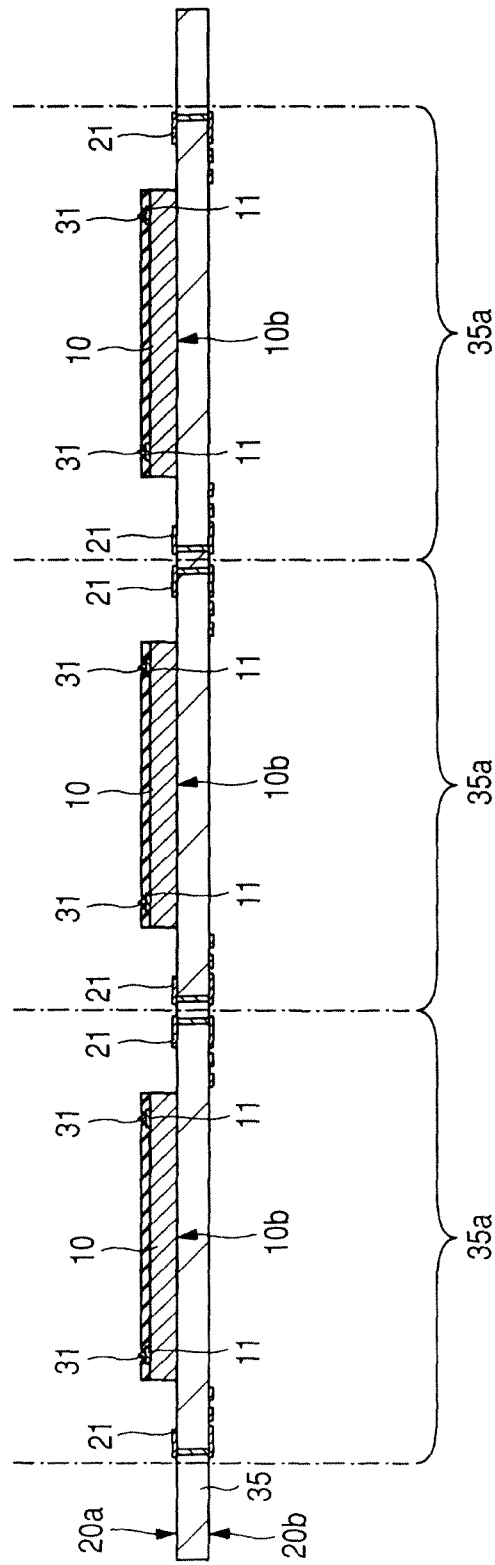
FIG. 13 is a section view showing a state where a semiconductor chip is mounted over a wiring substrate.

Next, the semiconductor chip prepared in the semiconductor chip preparing step is mounted over the wiring substrate (die bonding step). FIG. 13 is a section view showing a state where the semiconductor chip is mounted over the wiring substrate. In FIG. 13, a wiring substrate 35 is a so-called multiple-piece wiring substrate in which a plurality of the wiring substrates 20 (refer to FIG. 2) is formed integrally into one unit in a state where they are arranged in a matrix. Over the top surface 20a of the wiring substrate 35, a plurality of product formation regions 35a corresponding to the wiring substrate 20 shown in FIG. 2 is formed and in which, the terminals 21 shown in FIG. 1 and FIG. 2 are formed, respectively.

In the present step, the semiconductor chip 10 is mounted over the wiring substrate 35 in the state where the top surface 20a of the wiring substrate 35 and the back surface 10b of the semiconductor chip 10 face each other, that is, a so-called face-up mounting. The semiconductor chip 10 is fixed tightly in the chip mount region of each product formation region 35a via an adhesive, not shown schematically.

Figure 14:
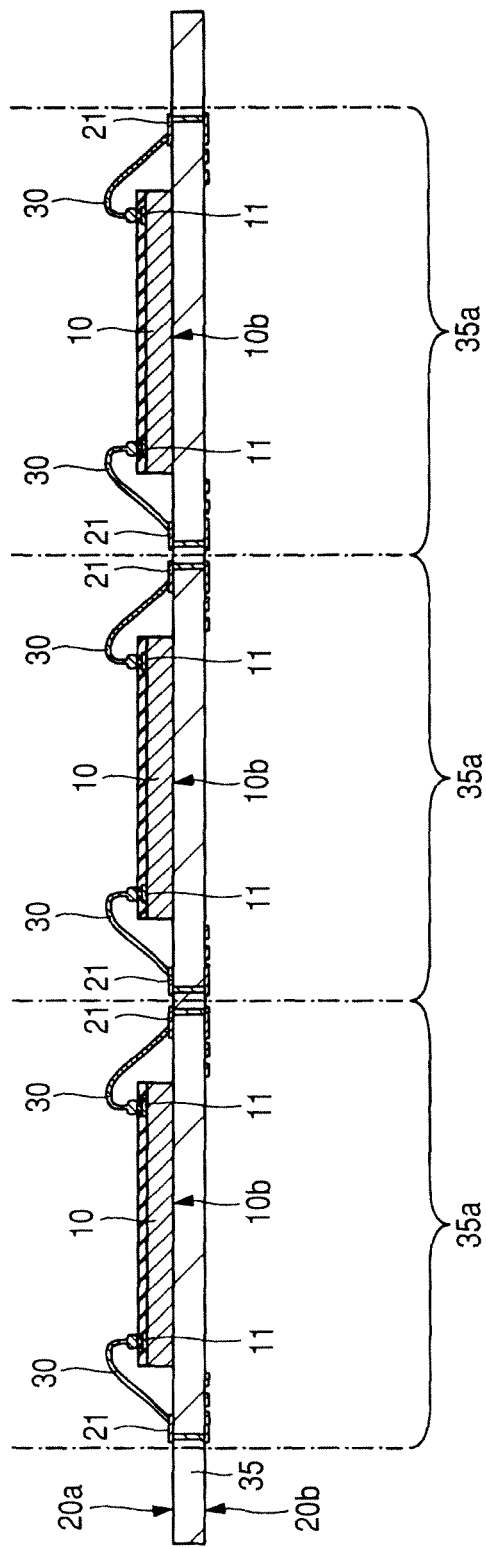
FIG. 14 is a section view showing a state where a plurality of pads of the semiconductor chip and terminals of the wiring substrate shown in FIG. 13 are electrically coupled via wires.

Next, the terminals 21 arranged around the semiconductor chip 10 are electrically coupled via the wires 30 (wire bonding step). FIG. 14 is a section view showing a state where the pads of the semiconductor chip shown in FIG. 13 and the terminals of the wiring substrate are electrically coupled via the wires. The detailed structure over the pad 11 shown in FIG. 14 is the same as that in FIG. 4 and FIG. 5, and thus, explanation is given using FIG. 4, FIG. 5, and FIG. 14. In the present step, first, a copper wire is prepared and one end part thereof is melted into the shape of a sphere and crimped onto the bump 31 (refer to FIG. 5). That is, first bonding is performed to the bump 31 (refer to FIG. 5). The crimping method is, for example, such that the tip end of the wire 30 is pressed toward the direction of the bump 31 and crimped thereto in the state where the wire 30 and the bump 31 are heated. At this time, it is also possible to apply ultrasonic waves, in addition to heat.

Here, the copper wire 30 has a hardness higher than that of a gold wire, and thus, a strong stress is applied in the direction of the pad 11 at the time of crimping. According to the present embodiment, however, the wire 30 is joined via the bump 31 (refer to FIG. 5) made of gold having a hardness lower than that of copper, and thus, the bump 31 relaxes the stress and prevents or suppresses the stress from being transmitted to the lower layer of the pad 11 (the insulating layer 16 or the wire 14 shown in FIG. 4 or the semiconductor element formed in the semiconductor element layer 13a). As a result, the breakage of the semiconductor chip 10 in the wire bonding step can be prevented, and thus, reliability can be improved.

The subsequent step, while sending out the wire from a capillary that holds the wire, moves the capillary in the direction of the terminal 21 so as to draw a predetermined wire loop shape as shown in FIG. 14, and rubs the end part on the opposite side of the wide width part 30b (refer to FIG. 5) of the wire 30 against the terminal 21 to crimp and join it thereto (second bonding). After that, when the wire 30 is cut, the wire 30 is obtained one end part of which is joined to the bump 31 and the other part of which is joined to the terminal 21. By the second bonding, the end part on the opposite side of the wide width part 30b of the wire 30 is joined to the terminal 21, however, a margin to cut unnecessary wires is required, and thus, the "end part" does not necessarily mean the tip end but includes the vicinity of the tip end.

Figure 15:
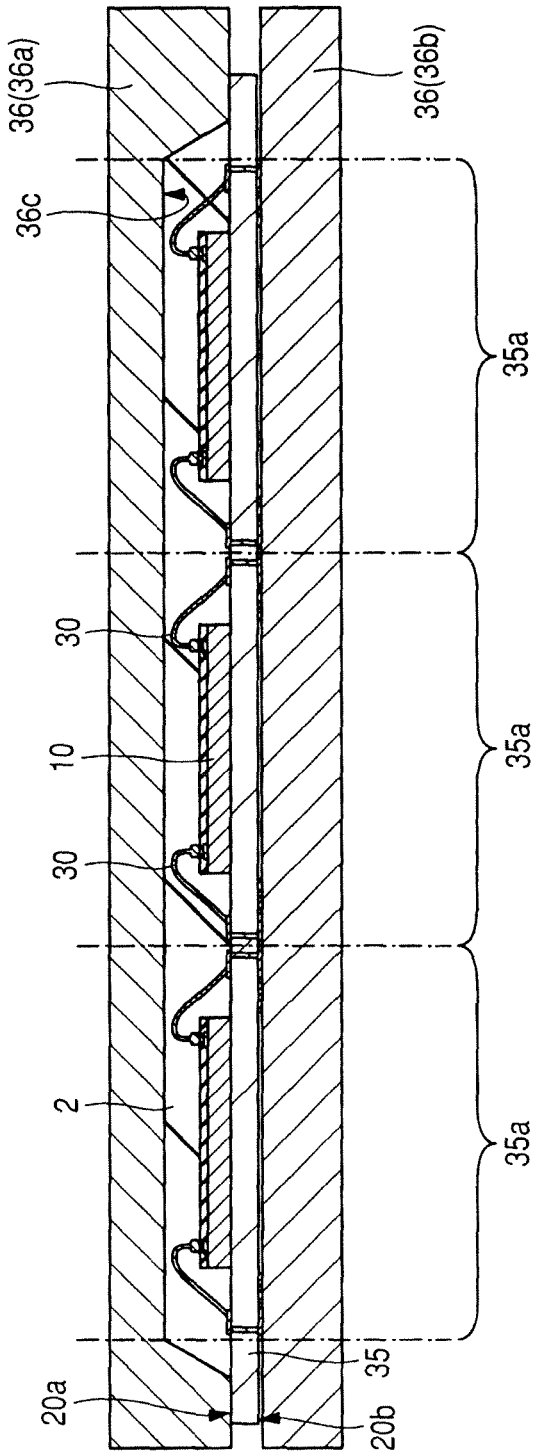
FIG. 15 is a section view showing a state where the side of the top surface of the wiring substrate shown in FIG. 14 is sealed with resin.

Next, the semiconductor chip 10 disposed on the side of the top surface 20a of the wiring substrate 35 and the wires 30 are sealed with resin and protected (sealing step). FIG. 15 is a section view showing a state where the side of the top surface of the wiring substrate shown in FIG. 14 is sealed with resin. The present step is performed by, for example, injecting the sealing resin 2 into a cavity 36c after arranging the wiring substrate 35 shown in FIG. 10 into the cavity 36c of a molding die 36 including an upper die 36a and a lower die 36b as shown in FIG. 15.

Next, in a ball mount step, a plurality of the solder balls 23 shown in FIG. 2 is formed on the side of the undersurface 20b of the wiring substrate 35. After that, the wiring substrate 35 (refer to FIG. 15) is cut and individualized along with the sealing resin 2 (refer to FIG. 15) for each product formation region 35a (refer to FIG. 15) and thus the CSP1s are obtained (individualizing step).

As described above, according to the present embodiment, by joining the wire 30 and the pad 11 via the bump 31 made of gold, which is a metal material having a hardness lower than that of copper, the stress to be applied to the semiconductor chip 10 at the time of wire bonding can be reduced, and thus, it is possible to improve reliability of a semiconductor device in which wire bonding using a copper wire is performed.

Further, by reducing the width Wc of the bump 31 narrower than the width Wb of the wide width part 30b of the wire 30, it is possible to firmly join the wire 30 and the pad 11 even when the opening 12a is reduced, and thus, the reliability of the electrical coupling can be improved.

Further, by using a stud bump as the bump 31, it is possible to firmly join the bump 31 and the pad 11 even when the recess part 11a is formed in the surface of the pad 11, and thus, the reliability of the electrical coupling of the wire 30 and the pad 11 can be improved.

Second Embodiment

Figure 16:
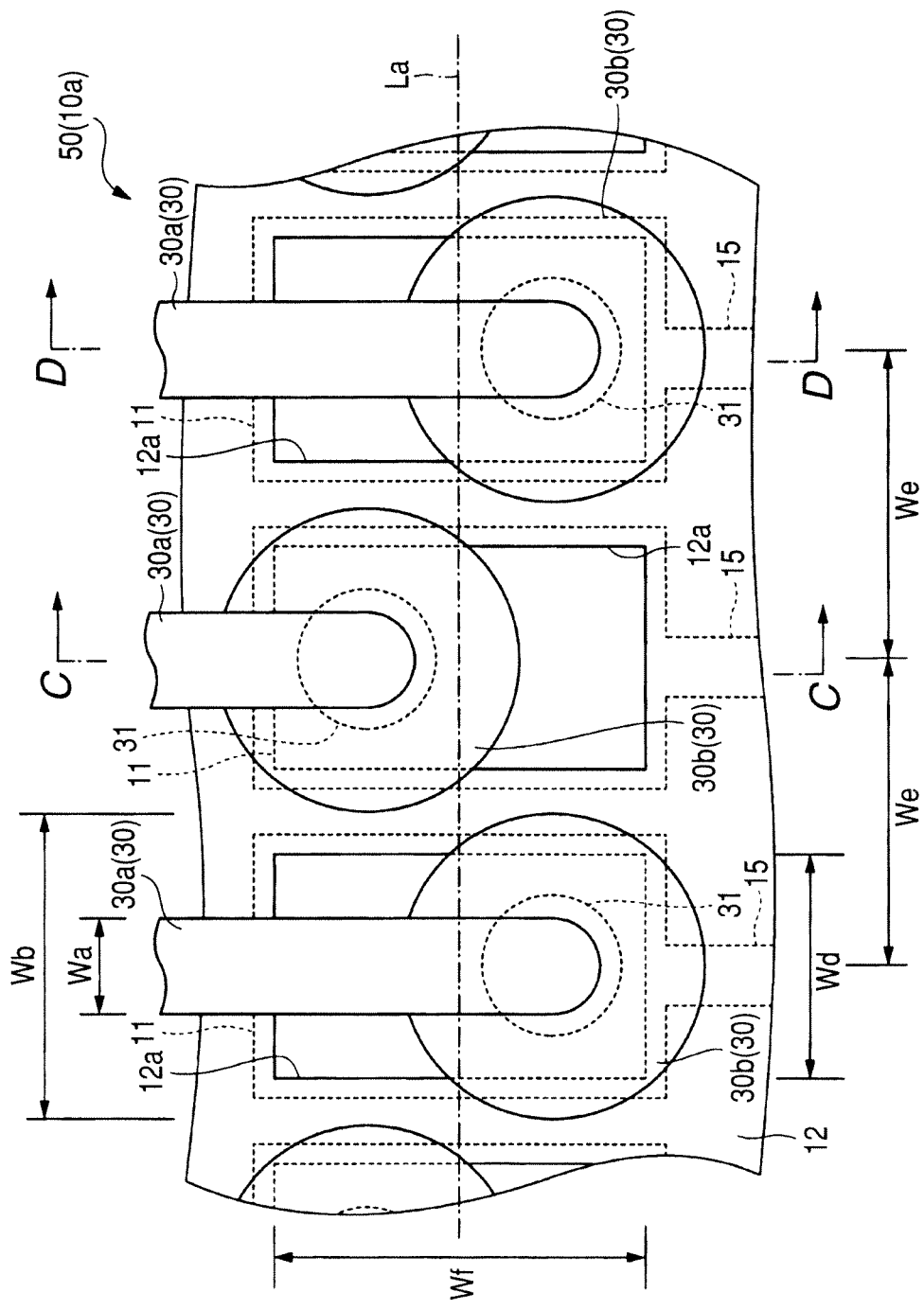
FIG. 16 is an enlarged plan view of essential parts showing the periphery of a pad of a semiconductor chip of a semiconductor device in a second embodiment of the present invention.
Figure 17:
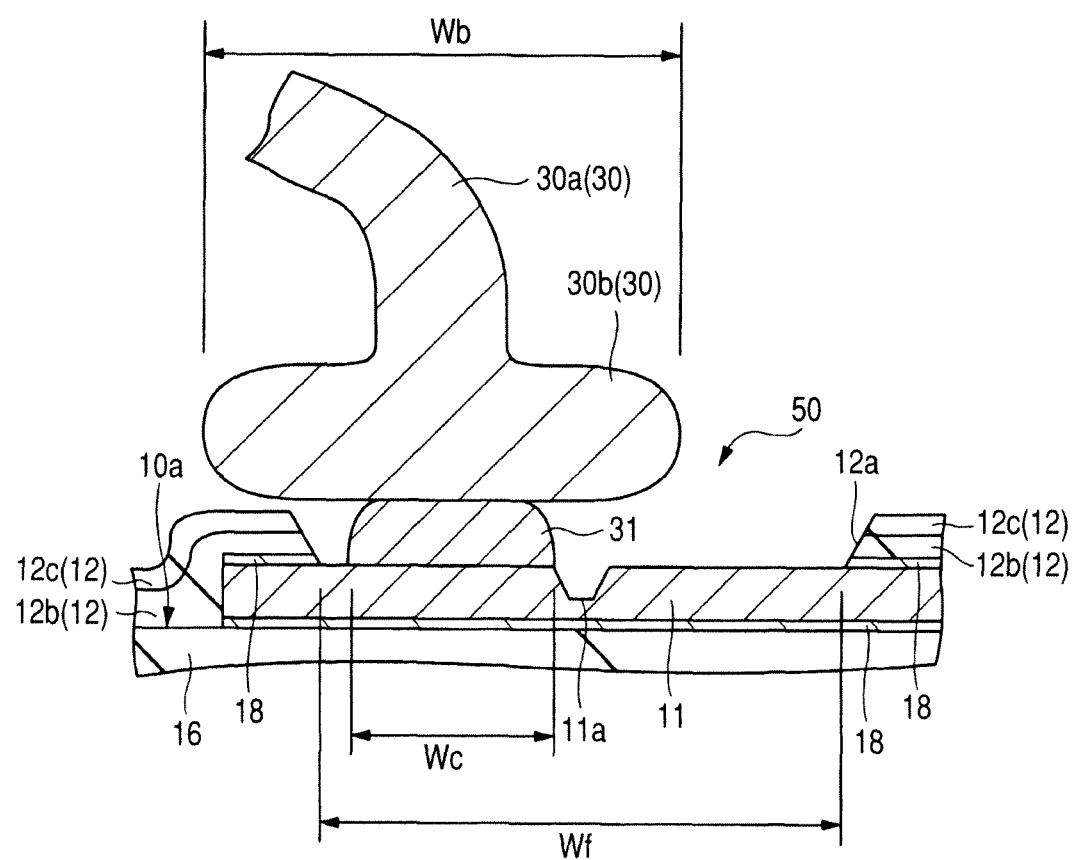
FIG. 17 is an enlarged section view of essential parts showing the periphery of one of the pads shown in FIG. 16.
Figure 18:
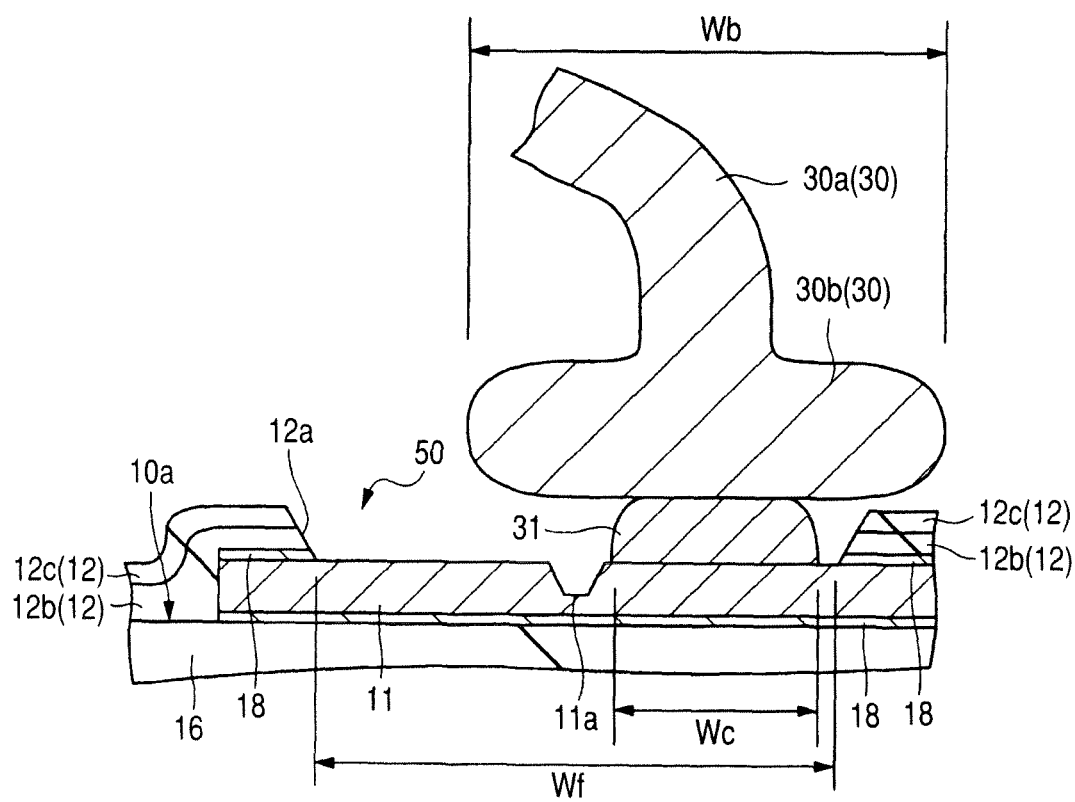
FIG. 18 is an enlarged section view of essential parts showing the periphery of a pad arranged adjacent to the pad shown in FIG. 17 of the pads shown in FIG. 16.

In the above-mentioned first embodiment, the aspect in which the bump 31 is arranged substantially at the center of the exposed surface of the pad 11 is explained. In a second embodiment, as a modified example of the above-mentioned first embodiment 1, an aspect in which the bump is arranged so as to be shifted from the center of the exposed surface of the pad and joined in a staggered manner is explained. FIG. 16 is an enlarged plan view of essential parts showing the periphery of a pad of a semiconductor chip of a semiconductor device in the second embodiment, and FIG. 17 and FIG. 18 are enlarged section views of essential parts showing the periphery of the pads to be arranged so as to be adjacent to each other of the pads shown in FIG. 16, respectively. FIG. 17 shows a section along C-C line shown in FIG. 16 and FIG. 18 shows a section along D-D line, respectively.

A point of difference between the semiconductor chip 10 in the first embodiment shown in FIG. 5 and FIG. 7 and a semiconductor chip 50 in the present second embodiment shown in FIG. 16 to FIG. 18 is the arrangement pitch of the pad 11 and the arrangement of the bump 31 and the wire 30 with respect to the opening 12a of the pad 11.

In the semiconductor chip 50 shown in FIG. 16 to FIG. 18, an arrangement pitch (the distance between the centers of the neighboring pads 11 in the arrangement direction of the pads 11) We of the pads 11 is narrower compared to that of the semiconductor chip 10 explained in the above-mentioned first embodiment. When the number of terminals, that is, the number of the pads 11 increases accompanying the improvement of the functions of a semiconductor chip, it is necessary to reduce the arrangement interval of the pads 11, that is, the arrangement pitch We in order to effectively make use of the space over the main surface 10a (called the reduction in pitch or reduction in pitch/increase in the number of pins).

As explained in the above-mentioned first embodiment, the width Wb of the wide width part 30 of the copper wire 30 is greater than the Wd of the opening 12a. Consequently, there arises a possibility that the neighboring wires 30 short-circuit if the arrangement pitch We of the pads 11 is reduced.

Hence, in the second embodiment, the wires 30 are arranged to be shifted alternately, that is, in a so-called staggered arrangement, with respect to a pad arrangement line La that connects the centers of the pads 11 (in more detail, the region exposed from the opening 12a). In more detail, the pads 11 are arranged along the pad arrangement line La with their centers aligned with each other. The wires 30 are arranged so that the wire (second wire) 30 that is joined so that the center of the wide width part 30 is arranged outside the pad arrangement line La (outside the semiconductor chip 50) is arranged adjacent to the wire (first wire) 30 that is joined so that the center of the wide width part 30 is arranged inside the pad arrangement line La (inside the semiconductor chip 50). By arranging the wires 30 in a staggered manner, in which the neighboring wires are shifted alternately with respect to the pad arrangement line La, the distance between the wide width parts 30b of the wires 30 can be increased, and thus, it is possible to prevent the short circuit between the neighboring wires 30.

Further, in the second embodiment, a length Wf in the direction intersecting the pad arrangement line La of the opening 12a is made greater than the width Wd in the direction along the pad arrangement line La. The width Wd is regulated by the arrangement pitch We of the pad 11, and thus, in order to realize the reduction in pitch, the width cannot be increased too much. Hence, in the second embodiment, by increasing the length Wf, the distance between the wide width parts 30b of the neighboring wires 30 is increased sufficiently to prevent the short circuit between the neighboring wires 30. For example, even when the width Wb of the wide width part 30b is equal to or greater than the arrangement pitch We of the pad 11, it is possible to prevent short circuit by increasing the length Wf.

In the second embodiment, the bumps 31 are also arranged in a staggered arrangement following the arrangement of the wires 30 described above, in which the bumps 31 are arranged shifted alternately with respect to the pad arrangement line La. In more detail, the bump (second bump) 31 that has its center outside the pad arrangement line La (outside the semiconductor chip 50) and which is joined to the wire (second wire) 30 is arranged adjacent to the bump (first bump) 31 that has its center on the inner side of the pad arrangement line La (on the inner side of the semiconductor chip 50) and which is joined to the wire (first wire) 30 in the exposed surface of the pad 11 (within the opening 12a). Thereby, the bump 31 and the wire 30 are joined with the center of the bump 31 aligned with the center of the wide width part 30b of the wire 30, that is, the wire 30 is joined to substantially the center of the bump 31 as a result. This is preferable from the viewpoint of improving the joint strength because it is possible to increase the joint area between the bump 31 and the wire 30. When the center of the bump 31 is aligned with the center of the wide width part 30b of the wire 30, it is possible to disperse the stress to be applied in the wire bonding step substantially in a uniform manner to the bump 31. Consequently, this is preferable from the viewpoint of preventing the breakage of a semiconductor chip by relaxing the stress at the time of wire bonding.

It is also possible to join the bump 31 to a region where the recess part 11a is not formed as shown in FIG. 17 and FIG. 18 by increasing the length Wf and arranging the bumps 31 to be shifted with respect to the pad arrangement line La. That is, it is possible to form the bump 31 avoiding the recess part 11a. As a result, the bump 31 is joined to substantially a flat surface. Here, even when the bump 31 is formed in such a manner that part of the bump 31 overlaps the recess part 11a, there is not a large difference in the joint strength compared to the case where the bump 31 is formed avoiding the recess part 11a as shown in FIG. 17 and FIG. 18. As explained in the above-mentioned first embodiment, however, the bump 31 functions to relax stress when the wire 30 is bonded. From the viewpoint of the stress relaxation function, it is preferable to join the bump 31 to a flat surface because the stress can be dispersed substantially in a uniform manner.

In the present second embodiment, the recess part 11a formed in each pad 11 is formed substantially in the center of the opening 12a as in the above-mentioned first embodiment. That is, the recess parts 11a are arranged with their centers aligned along the pad arrangement line.

Third Embodiment

Figure 19:
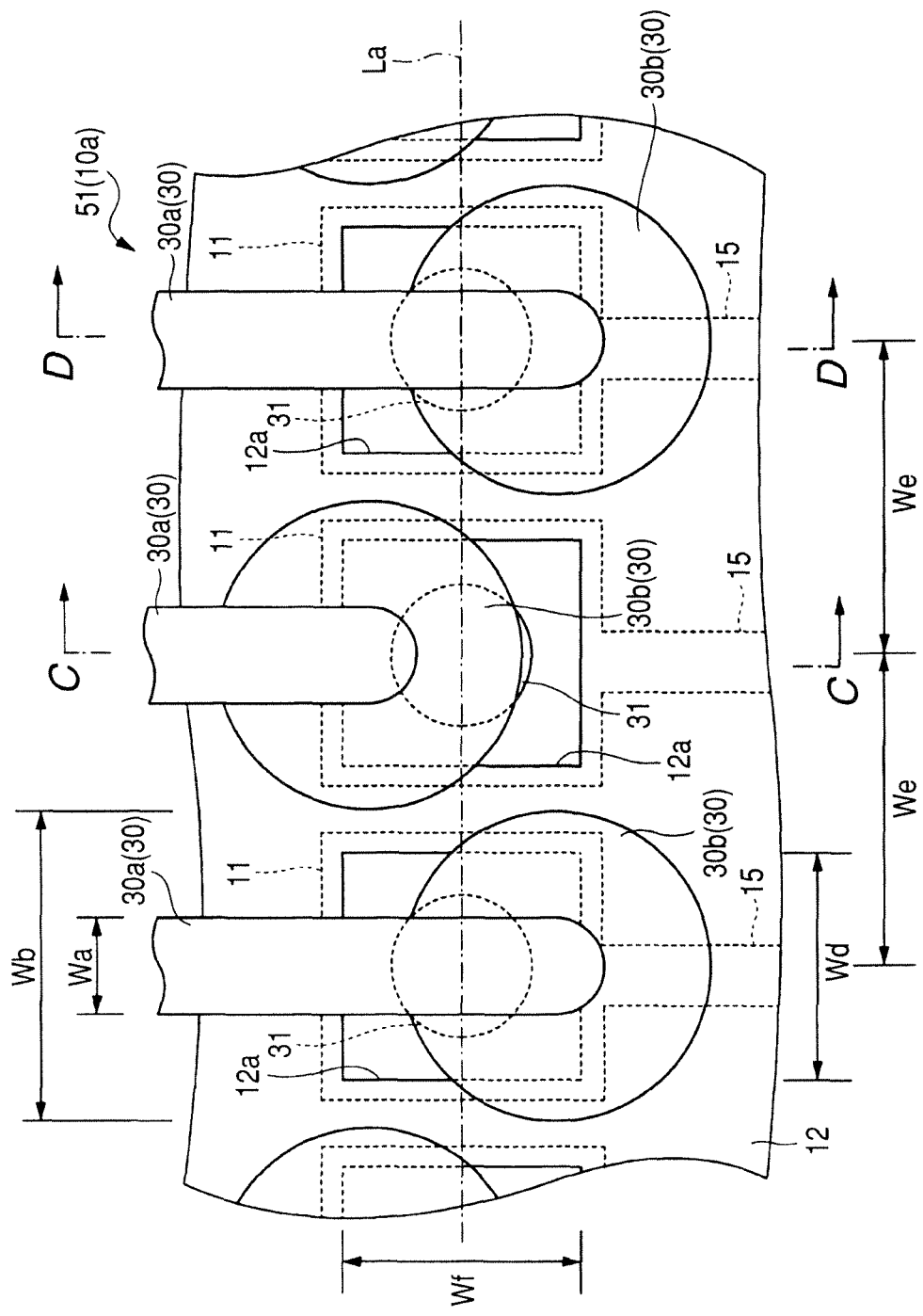
FIG. 19 is an enlarged plan view of essential parts showing the periphery of a pad of a semiconductor chip of a semiconductor device in a third embodiment of the present invention.
Figure 20:
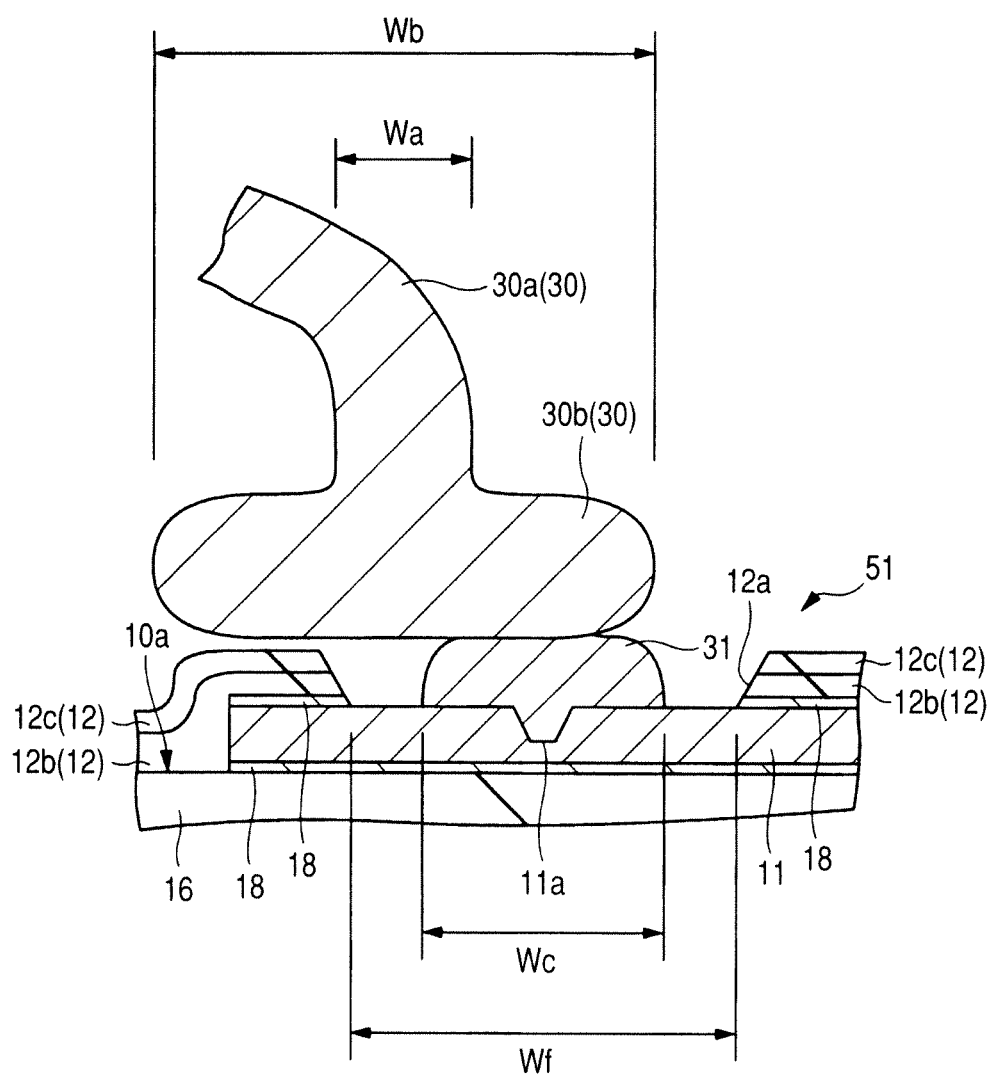
FIG. 20 is an enlarged section view of essential parts showing the periphery of one of the pads shown in FIG. 19.
Figure 21:
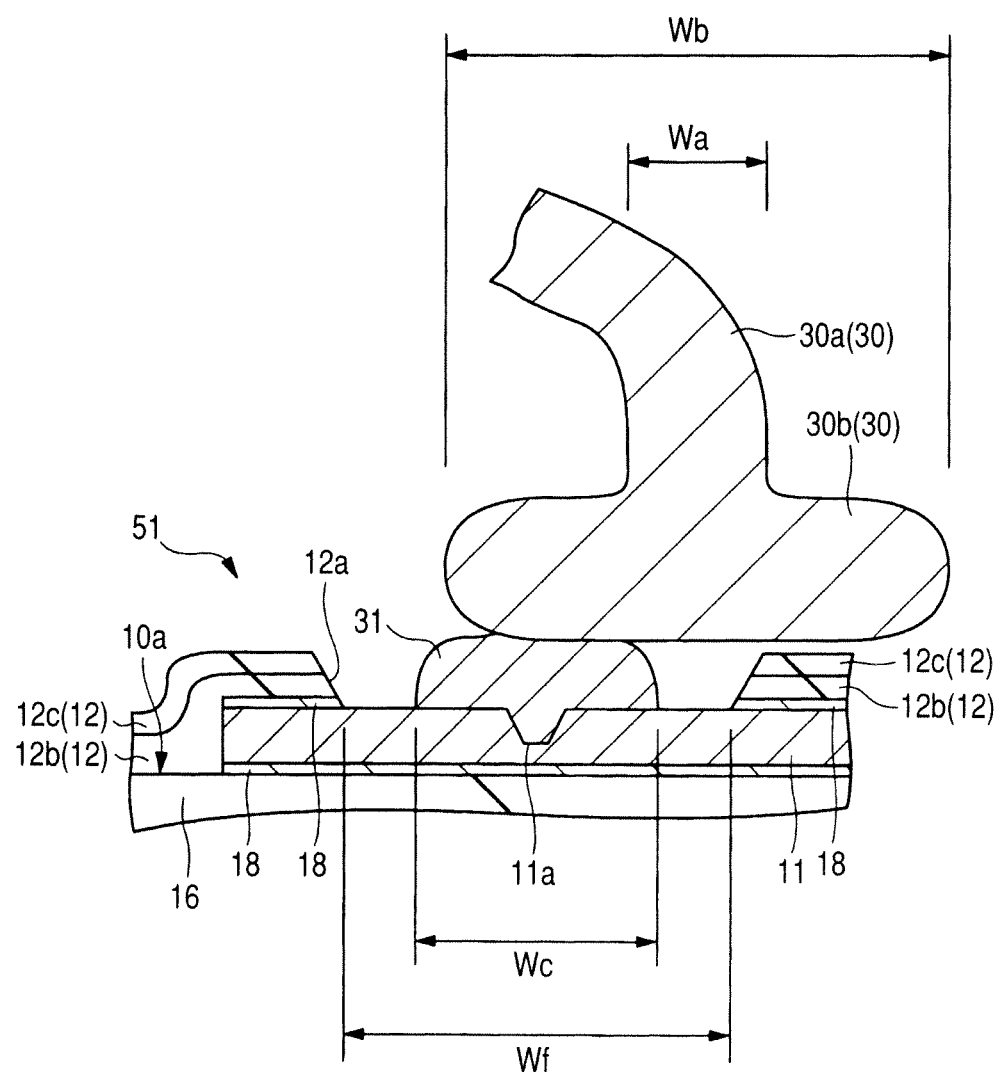
FIG. 21 is an enlarged section view of essential parts showing the periphery of a pad arranged adjacent to the pad shown in FIG. 20 of the pads shown in FIG. 19.

In the above-mentioned second embodiment, the aspect is explained, in which the bumps 31 are arranged shifted alternately with respect to the pad arrangement line La following the arrangement of the wires 30. In a third embodiment, as a modified example of the above-mentioned second embodiment, an aspect is explained, in which the wire is joined to be shifted from the position where the bump is formed. FIG. 19 is an enlarged plan view of essential parts showing the periphery of a pad of a semiconductor chip of a semiconductor device in the third embodiment and FIG. 20 and FIG. 21 are enlarged section views of essential parts respectively showing the periphery of the pads arranged adjacent to each other of the pads shown in FIG. 19. FIG. 20 shows a section along C-C line shown in FIG. 19 and FIG. 21 shows a section along D-D line, respectively.

A point of difference between the semiconductor device explained in the above-mentioned second embodiment and the semiconductor device in the present third embodiment is the positional relationship between the bump 31 and the wire 30 and the opening area of the opening 12a. In the present third embodiment, the wire 30 and the bump 31 are joined such that the center of the wire 30 (in more detail, the center of the wide width part 30b) is shifted from the center of the bump 31 in a staggered arrangement.

This is explained in more detail. In the third embodiment, the pads 11 of a semiconductor device 51 are arranged with their centers aligned along the pad arrangement line La and the bumps 31 are arranged with their centers aligned along the pad arrangement line La. On the other hand, the wires 30 are arranged in such a manner that the wire (second wire) 30 that is joined so that the center of the wide width part 30b is arranged outside the pad arrangement line La (outside the semiconductor chip 50) is arranged adjacent to the wire (first wire) 30 that is joined so that the center of the wide width part 30b is arranged on the inner side of the pad arrangement line La (on the inner side of the semiconductor chip 50).

As described above, in the present third embodiment, the bumps 31 are arranged not shifted from the pad arrangement line La, and thus, the length Wf in the direction intersecting (perpendicular to) the pad arrangement line La of the opening 12a can be reduced compared to that in the above-mentioned second embodiment. Further, the neighboring wires 30 are arranged shifted alternately with respect to the pad arrangement line La, and thus, it is possible to increase the distance between the wide width parts 30b of the wires 30 as explained in the above-mentioned second embodiment, and the short circuit between the neighboring wires 30 can be prevented.

When the wire 30 and the bump 31 are joined with their centers shifted from each other, however, there is a case where the joint area between the bump 31 and the wire 30 becomes smaller compared to that in the above-mentioned second embodiment. Further, there is a case where the stress to be applied in the wire bonding step concentrates in a specific direction. Hence, from the viewpoint of the joint strength between the bump 31 and the wire 30 and the viewpoint of relaxing stress in the wire bonding step, the structure of the semiconductor device explained in the above-mentioned second embodiment is preferable.

Fourth Embodiment

In the above-mentioned first to third embodiments, the example is explained, where the recess part 11a, which is a probe trace formed in the probe inspection step, is formed substantially in the center of the opening 12a. In a fourth embodiment, an aspect is explained, in which the recess part 11a is formed in a staggered manner to be shifted from the center of the opening 12a.

Figure 22:
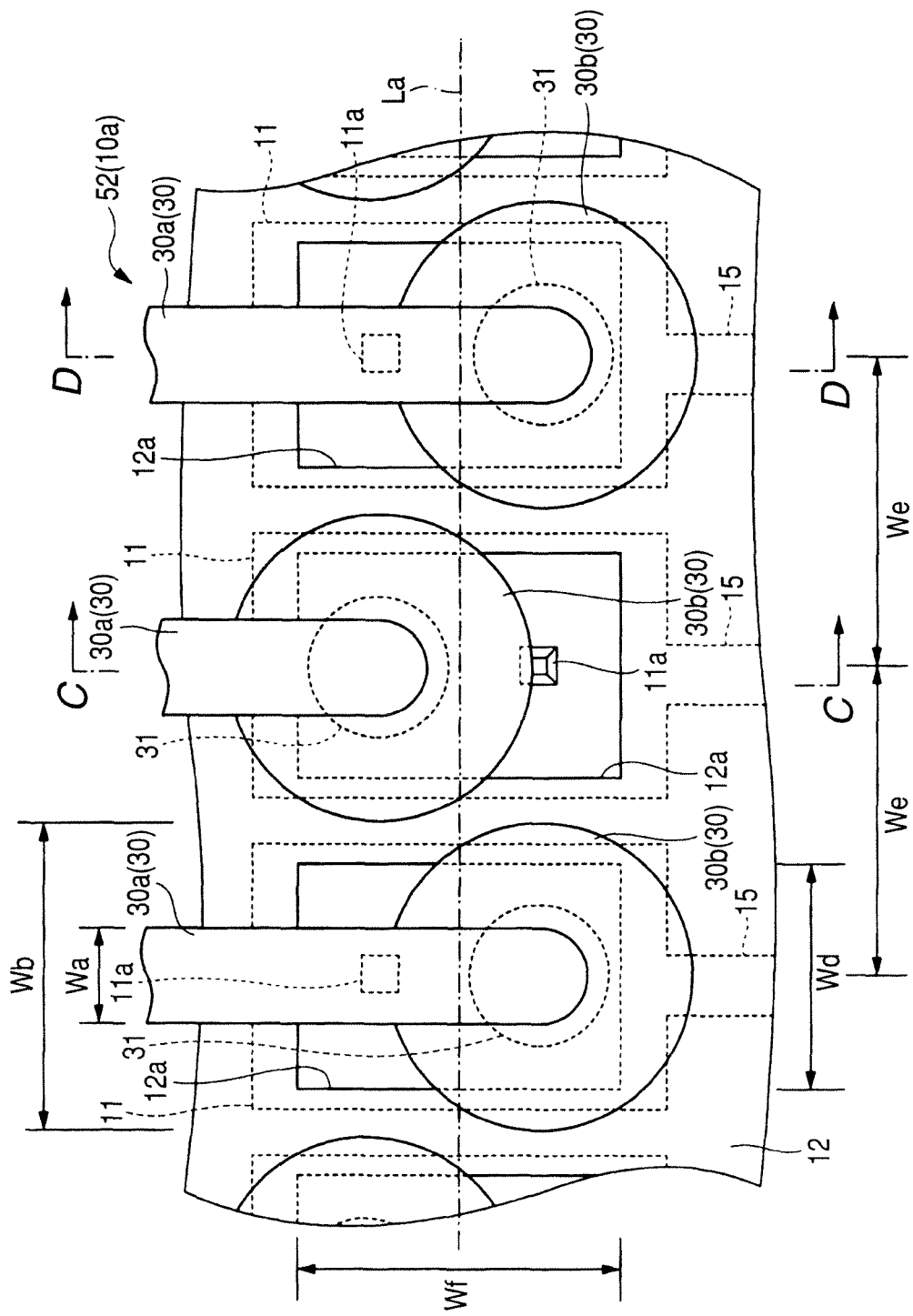
FIG. 22 is an enlarged plan view of essential parts showing the periphery of a pad of a semiconductor chip of a semiconductor device in a fourth embodiment of the present invention.
Figure 23:
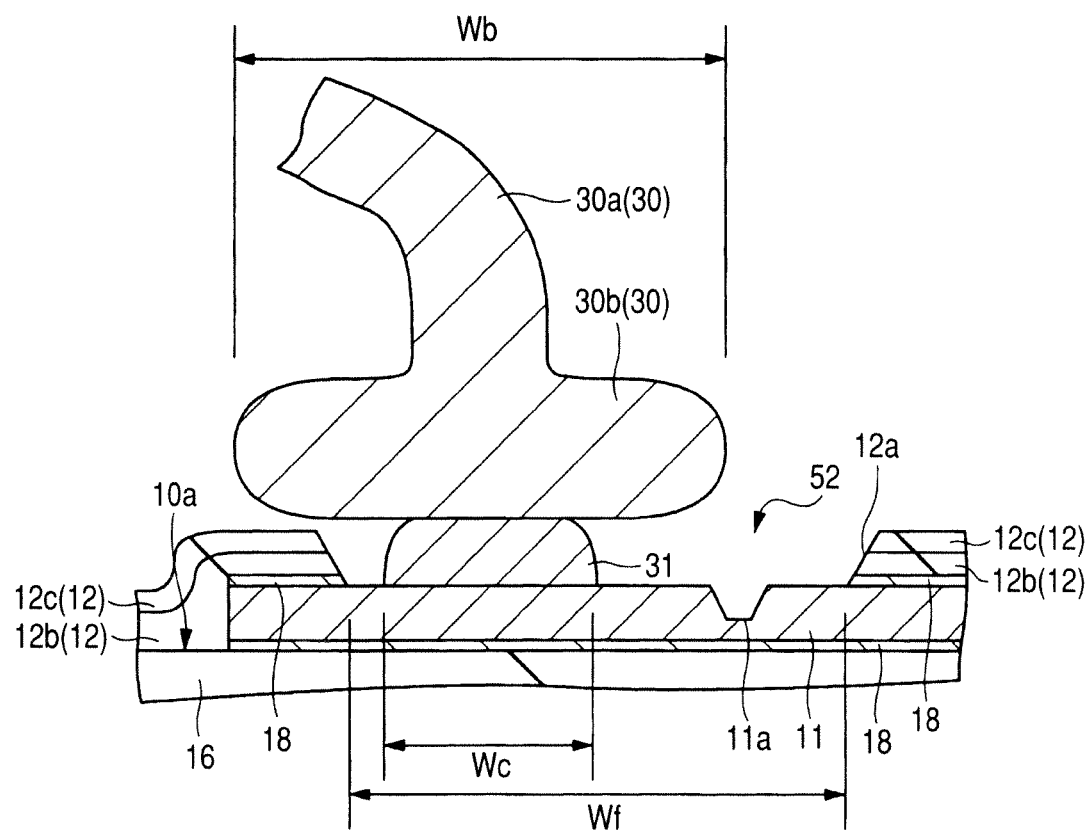
FIG. 23 is an enlarged section view of essential parts showing the periphery of one of the pads shown in FIG. 22.
Figure 24:
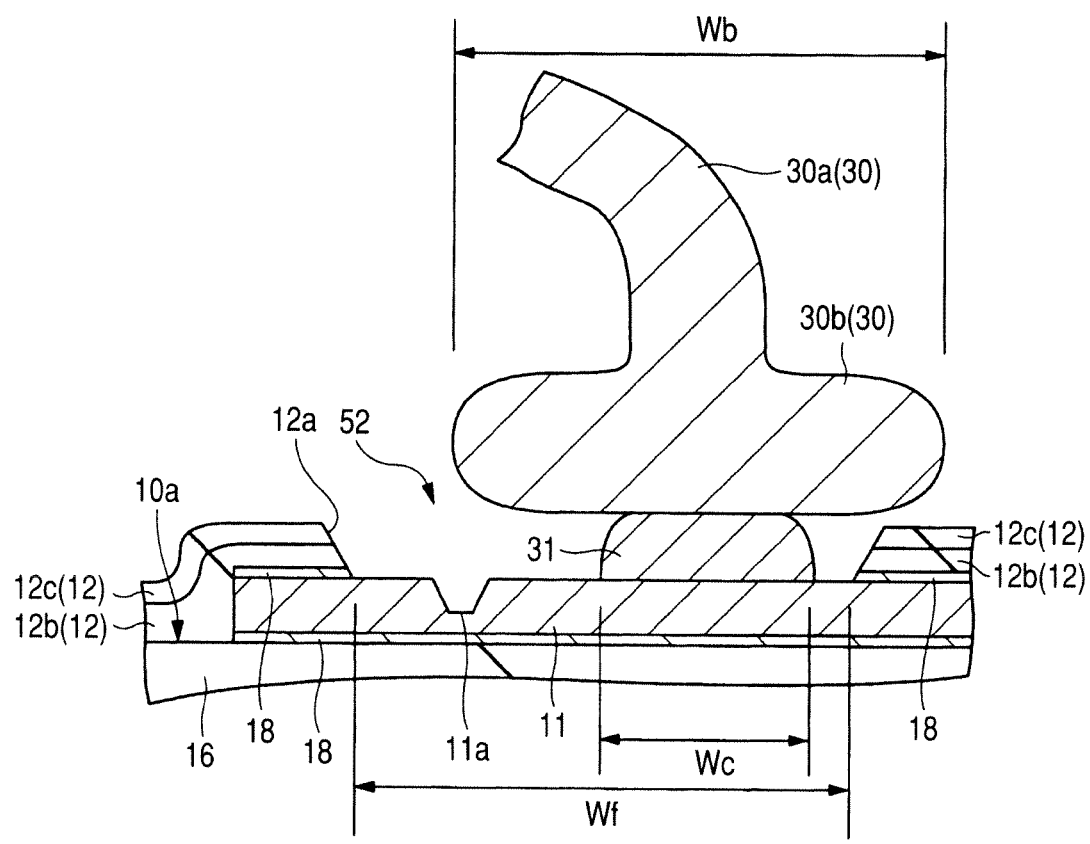
FIG. 24 is an enlarged section view of essential parts showing the periphery of a pad arranged adjacent to the pad shown in FIG. 23 of the pads shown in FIG. 22.

FIG. 22 is an enlarged plan view of essential parts showing the periphery of a pad of a semiconductor chip of a semiconductor device in the present fourth embodiment and FIG. 23 and FIG. 24 are enlarged section views of essential parts respectively showing the periphery of the pads arranged adjacent to each other of the pads shown in FIG. 22. FIG. 23 shows a section along C-C line shown in FIG. 22 and FIG. 24 shows a section along D-D line, respectively.

A point of difference between the semiconductor chip 50 explained in the above-mentioned second embodiment and a semiconductor chip 52 in the present embodiment shown in FIG. 22 to FIG. 24 is the opening area of the opening 12a and the position of the recess part 11a with respect to the opening 12a.

In the semiconductor chip 50 in the above-mentioned second embodiment, the recess part 11a is formed substantially in the center of the opening 12a. In the semiconductor chip 52 in the present fourth embodiment, however, the recess parts 11a are formed to be shifted alternately with respect to the pad arrangement line La connecting the centers of the pads 11.

This is explained in more detail. In the present fourth embodiment, the pads 11 are arranged side by side with their centers aligned along the pad arrangement line La and the recess parts 11a are arranged in such a manner that the recess part (second recess part) 11a having its center outside the pad arrangement line La (outside the semiconductor chip 52) is arranged adjacent to the recess part (first recess part) 11a having its center on the inner side of the pad arrangement line La (on the inner side of the semiconductor chip 52). On the other hand, the bumps 31 are arranged (joined) at positions that do not overlap respective recess parts 11a within the openings 12a and the wire 30 is joined over the bump 31 with their centers aligned. In detail, the center of the wide width part 30b of the wire 30 is aligned with the center of the bump 31.

As described above, by arranging the recess part 11a in a staggered manner to be shifted from the center of the opening 12a, it is possible to join the bump 31 to a region where the recess part 11a is not formed more securely compared to the above-mentioned second embodiment. That is, it is possible to form the bump 31 avoiding the recess part 11a without fail. Thereby, it is possible to join the bump 31 to a flat surface, and thus, as explained in the above-mentioned second embodiment 2, the stress to be applied in the wire boding step can be dispersed substantially in a uniform manner and the breakage of the semiconductor chip 52 can be prevented.

Further, according to the present fourth embodiment, it is possible to reduce the length Wf of the opening 12a more compared to the above-mentioned second embodiment, and thus, the opening area can be reduced.

The present fourth embodiment is preferable compared to the above-mentioned third embodiment in that the wire 30 and the bump 31 are joined with their centers aligned, and thus, the stress to be applied in the wire bonding step can be dispersed uniformly. Further, the present fourth embodiment is preferable compared to the above-mentioned third embodiment from the viewpoint of the joint strength because the wire 30 and the bump 31 are joined with their centers aligned and thereby the joint area between the wire 30 and the bump 31 can be secured large.

In the present fourth embodiment, the recess parts 11a are arranged in such a manner that the centers thereof are shifted alternately inward and outward from the pad arrangement line La, and such a structure can be realized by arranging the probes in a staggered manner in the probe inspection step explained in the above-mentioned first embodiment.

The invention made by the inventors of the present invention is explained specifically based on the embodiments, however, the present invention is not limited to the above-mentioned embodiments and it is needless to say that there can be various modifications within the scope not deviating from its gist.

For example, in the first to fourth embodiments, the characteristic parts of each structure are explained and it is also possible to apply the present invention in a combination of these characteristic parts.

Further, for example, in the first to fourth embodiments, as an example of a semiconductor device using the copper wire 30, a semiconductor device is illustrated and explained, in which a semiconductor chip is mounted over a wiring substrate, however, an object over which a semiconductor chip is mounted is not limited to a wiring substrate and it is also possible to mount a semiconductor chip over a lead frame (substrate).

Figure 25:
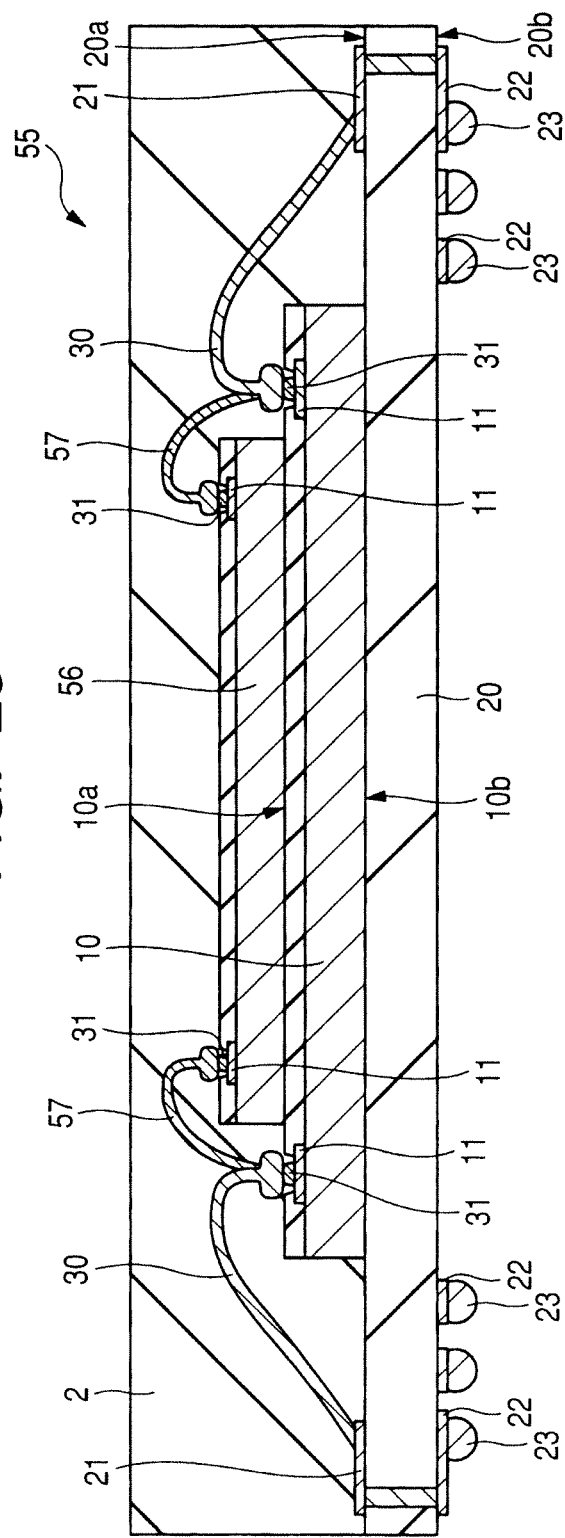
FIG. 25 is a section view showing an outline of a semiconductor device having a plurality of semiconductor chips.

Furthermore, for example, the number of semiconductor chips to be mounted within one semiconductor device is not limited to one as explained in the first to fourth embodiments, and the present invention can be applied to a semiconductor device having a plurality of semiconductor chips. FIG. 25 is a section view showing an outline of a semiconductor device having a plurality of semiconductor chips. For example, in a semiconductor device 55 shown in FIG. 25, the two semiconductor chips 10 are mounted over the wiring substrate 20, respectively, in a face-up mounting manner.

Here, the pad 11 of a semiconductor chip 56 on the side of the upper tier is electrically coupled to the pad (terminal) 11 of the semiconductor chip 10 disposed on the side of the lower tier via a copper wire 57 and the semiconductor chip 10 on the side of the lower tier is coupled to the terminal 21 via the copper wire 30. That is, to the pad 11 of the semiconductor chip 10, the second bond side of the wire 57 is joined. In the wire bonding step, when the second bond side is joined, the wire is joined to an object to which the wire is joined by rubbing the wire thereto, and thus, a heavier load is applied than that applied to the first bond side. As shown in FIG. 25, however, the pad 11 of the semiconductor chip 10 and the wire 57 are joined via the bump 31 made of a gold, a metal material having a hardness lower than that of copper, and thus, stress can be relaxed. Hence, even when the second bond side of the copper wire 57 is joined to the pad 11, it is possible to prevent or suppress damage to the semiconductor chip 10.

As described in the first embodiment, in the second bonding, the end part on the opposite side of the wide width part 30b of the wire 30 is joined to the terminal 21, however, a margin for cutting unwanted wires is necessary, and thus, the "end part" does not necessarily means the tip end but includes the vicinity of the tip end.

The present invention can be utilized in a semiconductor device in which a wire made of Cu (copper) is bonded to an electrode pad formed over the main surface of a semiconductor chip.

What is claimed is:

1. A method of manufacturing a semiconductor device comprising the steps of:
   (a) providing a wiring substrate including a terminal formed over a first surface of the wiring substrate;
   (b) after the step (a), mounting a semiconductor chip over the first surface of the wiring substrate such that a back surface of the semiconductor chip faces the first surface of the wiring substrate, and such that the semiconductor chip is located in an area spaced apart from the terminal, wherein:
      the semiconductor chip has a main surface, an electrode pad formed over the main surface, and the back surface opposite to the main surface, and
      a surface of the electrode pad having a recess;
   (c) after the step (b), electrically connecting the electrode pad of the semiconductor chip with the terminal of the wiring substrate via a wire, wherein:
      the wire is comprised of copper, and
      the wire has a first part having a diameter greater than a diameter of a second part of the wire;
   wherein the step (c) has following steps (c1)-(c2):
      (c1) electrically connecting the first part of the wire with the electrode pad of the semiconductor chip via a bump covering the recess formed on the surface of the electrode pad such that the first part of the wire is arranged over the recess; and (c2) after the step (c1), electrically connecting the second part of the wire with the terminal of the wiring substrate, wherein the recess is fully covered with the bump in plan view, and wherein the bump is comprised of a metal material having hardness lower than that of copper.

2. The method according to claim 1, wherein an insulating layer is formed under the electrode pad.

3. The method according to claim 1, wherein the recess is formed by contacting a probe to the surface of the electrode pad of the semiconductor chip.

4. The method according to claim 1, wherein a part of the bump is embedded in the recess.

5. The method according to claim 1, wherein the metal material is comprised of gold, palladium, platinum, silver, lead-tin alloy or tin.

6. The method according to claim 1, wherein an insulating film is formed over the main surface of the semiconductor chip such that the surface of the electrode pad is exposed from an opening formed in the insulating film; and wherein in cross-section view, the diameter of the first part of the wire is greater than a width of the opening.

7. The method according to claim 1, wherein the first part has an oval-like shape in cross-sectional view.

8. A method of manufacturing a semiconductor device comprising the steps of:
  (a) providing a wiring substrate including a terminal formed over a first surface of the wiring substrate;
  (b) after the step (a), mounting a semiconductor chip over the first surface of the wiring substrate such that a back surface of the semiconductor chip faces the first surface of the wiring substrate, and such that the semiconductor chip is located in an area spaced apart from the terminal, wherein:
    the semiconductor chip has a main surface, an electrode pad formed over the main surface, and the back surface opposite to the main surface, and
    a surface of the electrode pad having a recess;
  (c) after the step (b), electrically connecting the electrode pad of the semiconductor chip with the terminal of the wiring substrate via a wire, wherein:
    the wire is comprised of copper, and
    the wire has a wide width part having a diameter greater than a diameter of another part of the wire;
  wherein the step (c) has following steps (c1)-(c2):
    (c1) electrically connecting the wide width part of the wire with the electrode pad of the semiconductor chip via a bump covering the recess formed on the surface of the electrode pad such that the wide width part of the wire is arranged over the recess; and
    (c2) after the step (c1), electrically connecting the other part of the wire with the terminal of the wiring substrate,
  wherein the bump is comprised of a metal material having hardness lower than that of copper, and
  wherein a part of the bump is embedded in the recess.

9. The method according to claim 8, wherein an insulating layer is formed under the electrode pad.

10. The method according to claim 8, wherein the recess is formed by contacting a probe to the surface of the electrode pad of the semiconductor chip.

11. The method according to claim 8, wherein the metal material is comprised of gold, palladium, platinum, silver, lead-tin alloy or tin.

12. The method according to claim 8, wherein an insulating film is formed over the main surface of the semiconductor chip such that the surface of the electrode pad is exposed from an opening formed in the insulating film; and wherein in cross-section view, the diameter of the wide width part of the wire is greater than a width of the opening.

13. The method according to claim 8, wherein the wide width part has an oval-like shape in cross-sectional view.

* * * * *